United States Patent
Yang et al.

(10) Patent No.: US 9,748,332 B1
(45) Date of Patent: Aug. 29, 2017

(54) NON-VOLATILE SEMICONDUCTOR MEMORY

(71) Applicant: Macronix International Co., Ltd., Hsinchu (TW)

(72) Inventors: Chih Kai Yang, Kaohsiung (TW); Chen Yu Cheng, Taipei (TW); Shih Chin Lee, Taichung (TW); Ching Hung Wang, Hsinchu (TW); Tzung-Ting Han, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/374,515

(22) Filed: Dec. 9, 2016

(51) Int. Cl.
*H01L 27/115* (2017.01)
*H01L 29/06* (2006.01)
*H01L 29/788* (2006.01)
*H01L 29/66* (2006.01)
*H01L 27/11521* (2017.01)

(52) U.S. Cl.
CPC .... *H01L 29/0649* (2013.01); *H01L 27/11521* (2013.01); *H01L 29/66825* (2013.01); *H01L 29/7883* (2013.01)

(58) Field of Classification Search
CPC .................................................. H01L 27/11521
USPC .......................................... 438/264; 257/321
See application file for complete search history.

(56) References Cited

U.S. PATENT DOCUMENTS

| | | | | |
|---|---|---|---|---|
| 9,502,427 | B2* | 11/2016 | Shin | H01L 27/11521 |
| 2012/0037975 | A1* | 2/2012 | Cho | H01L 21/764 257/321 |
| 2012/0126306 | A1 | 5/2012 | Kawaguchi et al. | |
| 2012/0132982 | A1* | 5/2012 | Lee | H01L 21/28273 257/321 |
| 2012/0132985 | A1* | 5/2012 | Kai | H01L 27/11521 257/326 |
| 2013/0026600 | A1* | 1/2013 | Matthew | H01L 21/764 257/522 |
| 2013/0277730 | A1 | 10/2013 | Jung et al. | |
| 2014/0042518 | A1* | 2/2014 | Shim | H01L 29/42328 257/321 |
| 2014/0106537 | A1* | 4/2014 | Kim | H01L 21/764 438/424 |
| 2014/0151779 | A1* | 6/2014 | Cho | H01L 21/764 257/316 |
| 2015/0236028 | A1 | 8/2015 | Oh et al. | |
| 2015/0236111 | A1* | 8/2015 | Lee | H01L 29/42364 438/421 |

(Continued)

*Primary Examiner* — George Fourson, III
(74) *Attorney, Agent, or Firm* — Fish & Richardson P.C.

(57) ABSTRACT

A semiconductor device includes a semiconductor substrate, multiple memory cells on the semiconductor substrate arranged along a first dimension and along a second dimension that is orthogonal to the first dimension, in which each memory cell of the multiple memory cells includes a channel region in the semiconductor substrate, a tunnel dielectric layer on the channel region, and a first electrode layer on the tunnel dielectric layer. Along the first dimension, the channel region of each memory cell of the multiple memory cells is separated from the channel region of an adjacent memory cell of the multiple memory cells by a corresponding first air gap, each first air gap extending from below an upper surface of the semiconductor substrate up to an inter-electrode dielectric layer.

16 Claims, 30 Drawing Sheets

(56) References Cited

U.S. PATENT DOCUMENTS

2016/0260726 A1* 9/2016 Shin .................. H01L 27/11521
2016/0343608 A1* 11/2016 Umehara .......... H01L 21/76224

* cited by examiner

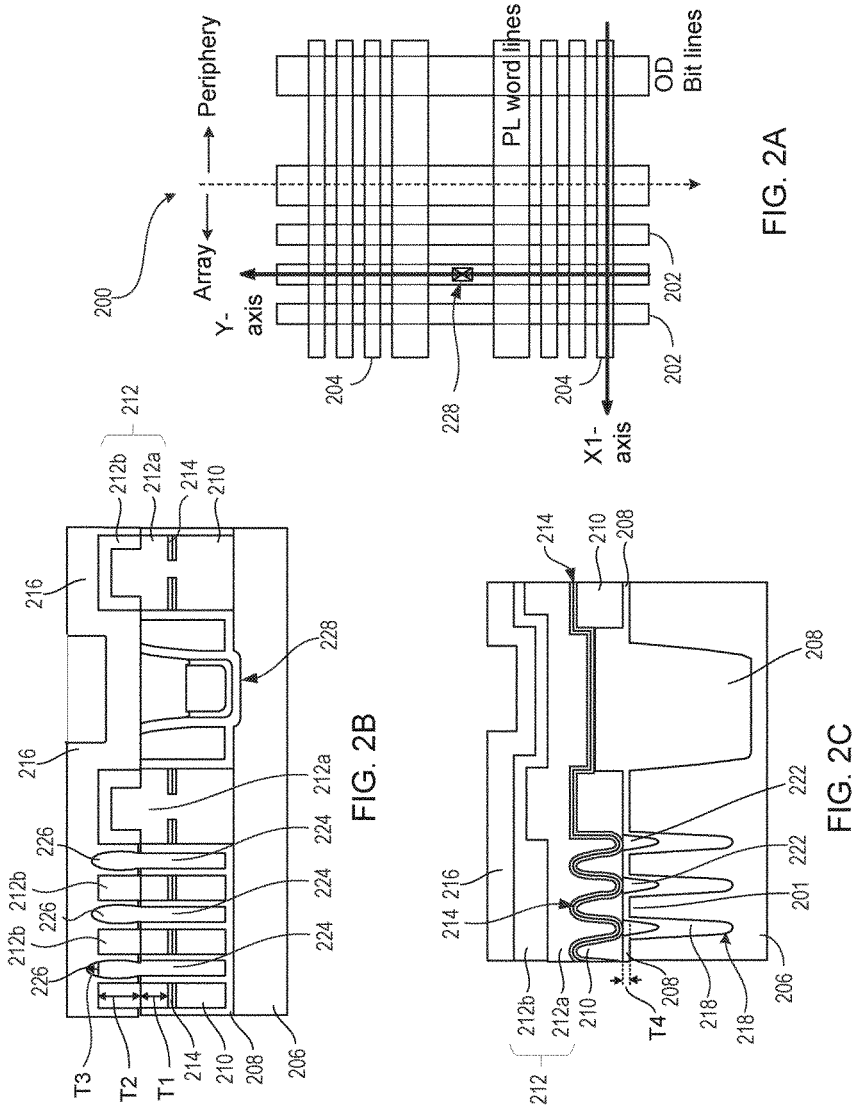

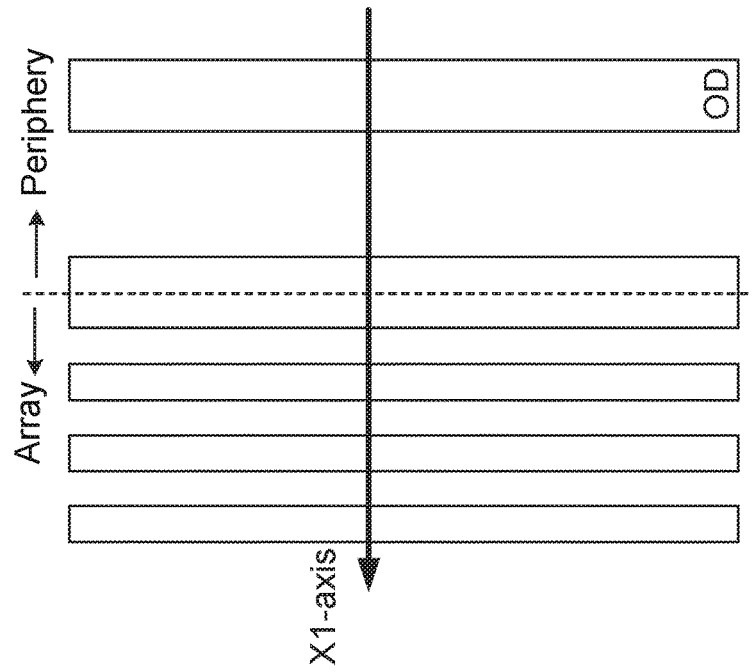
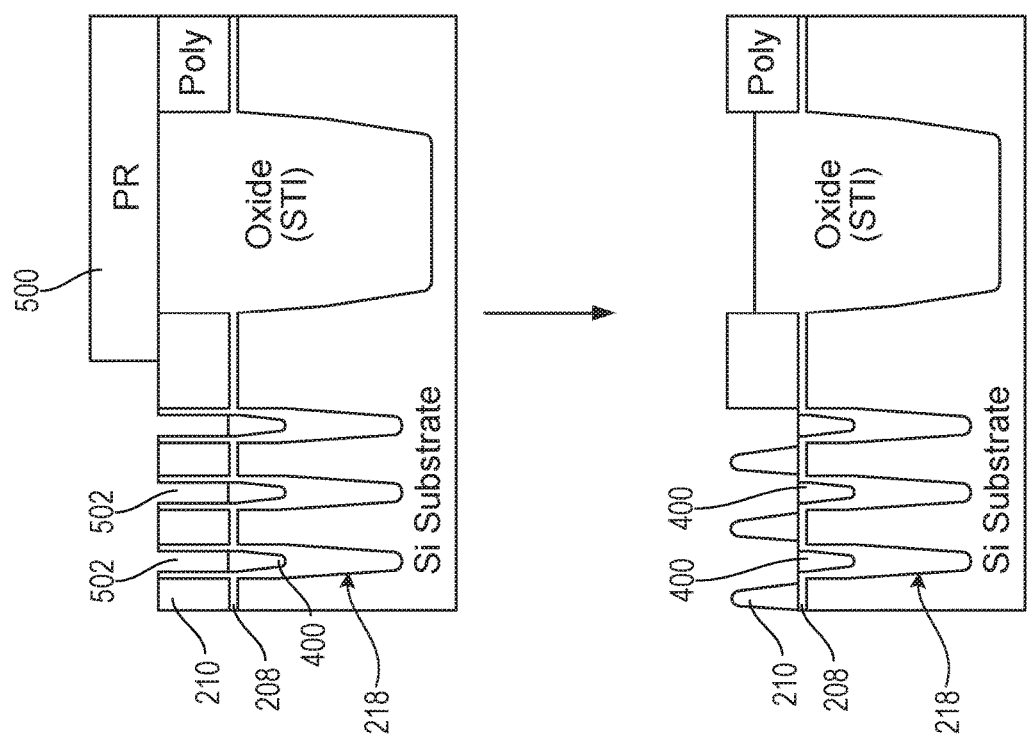
FIG. 5B
FIG. 5A

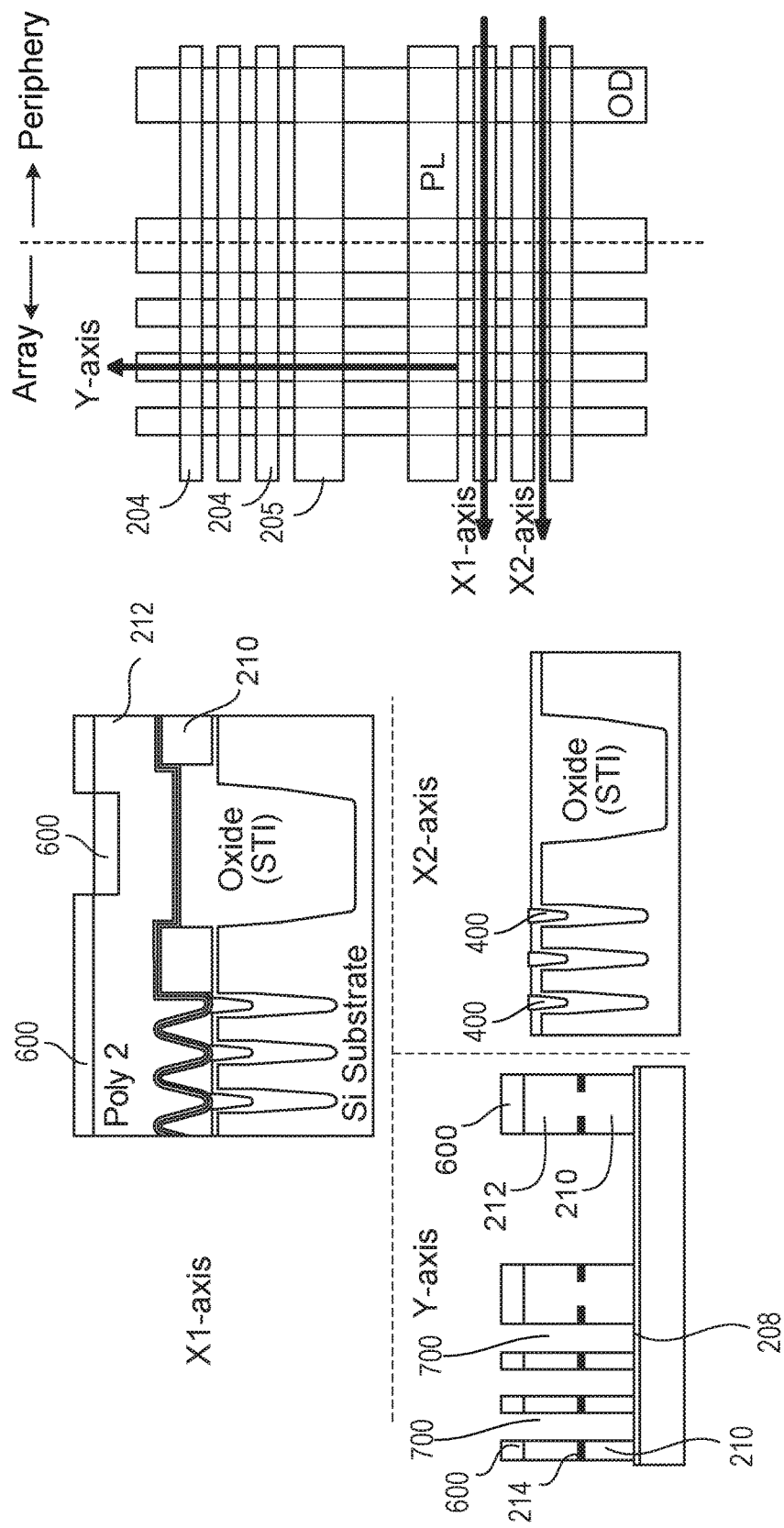

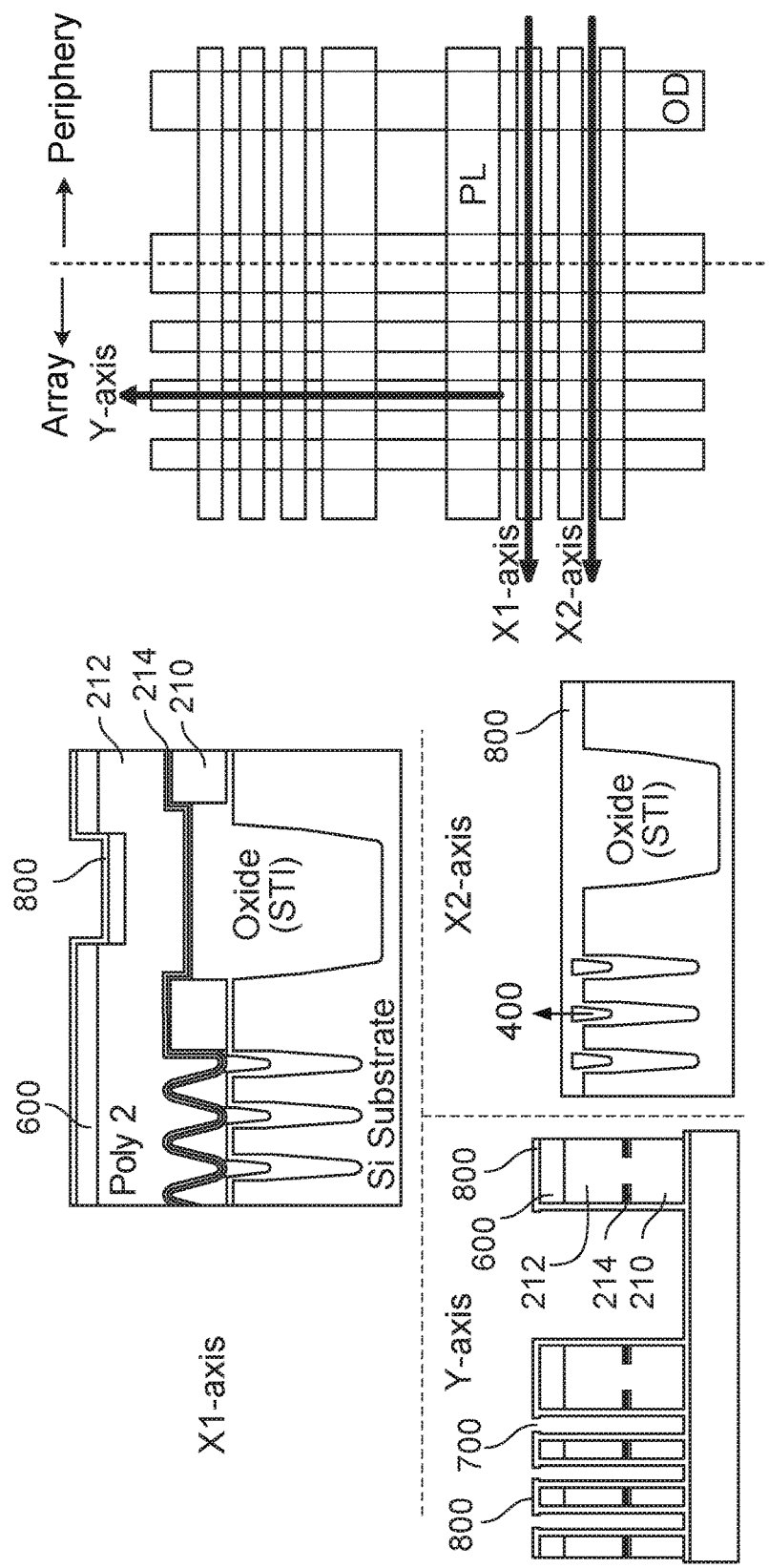

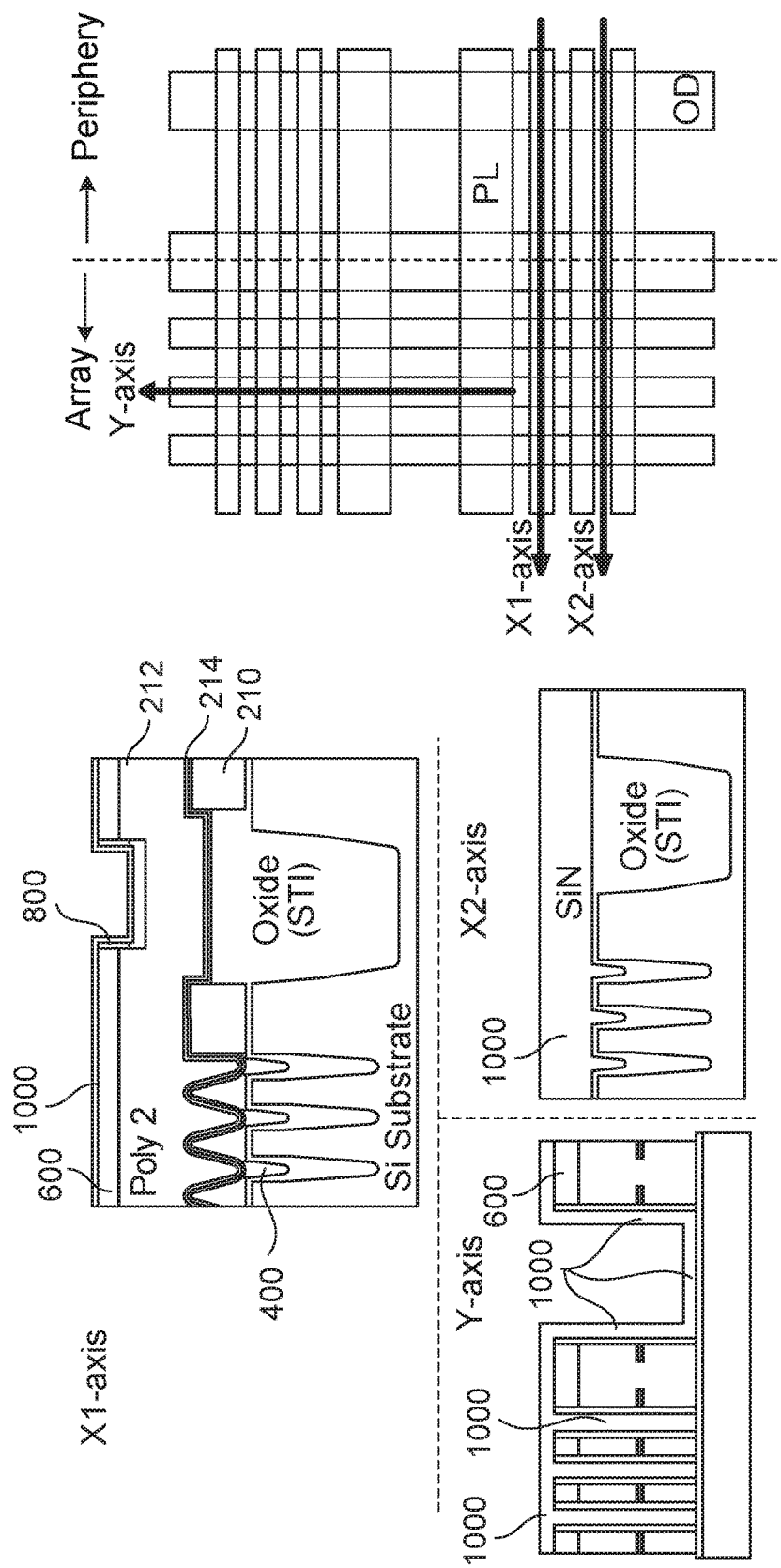

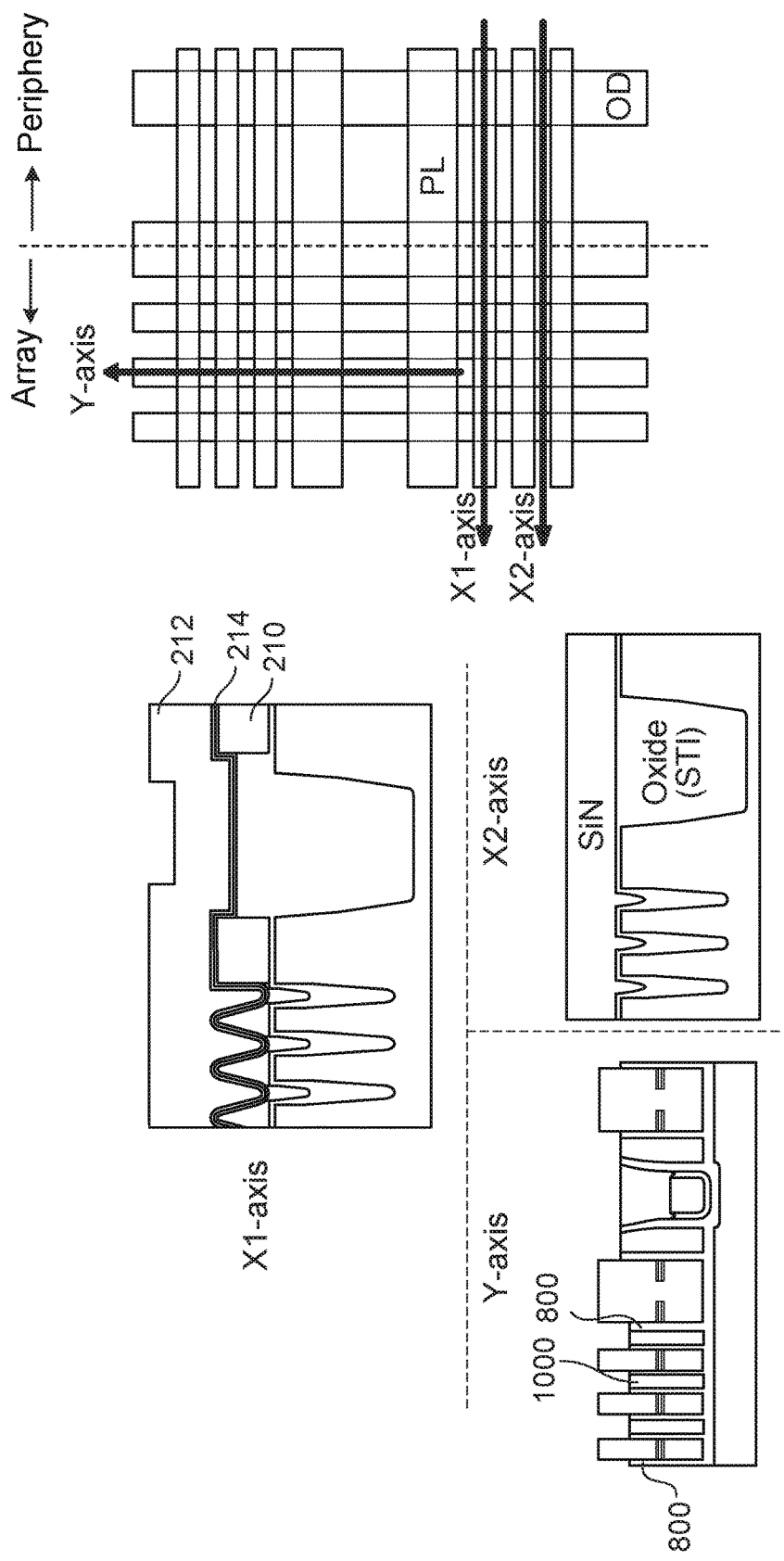

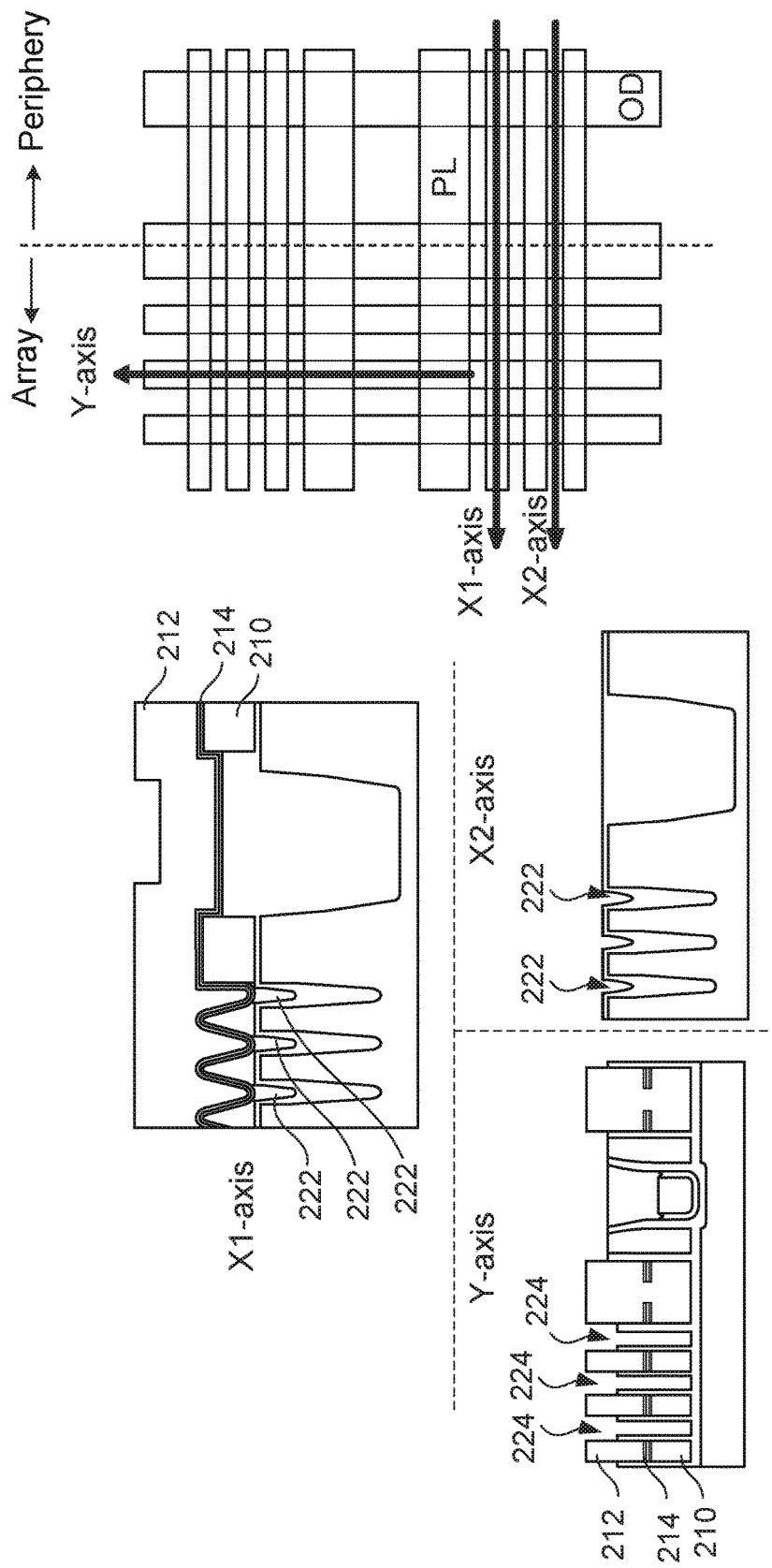

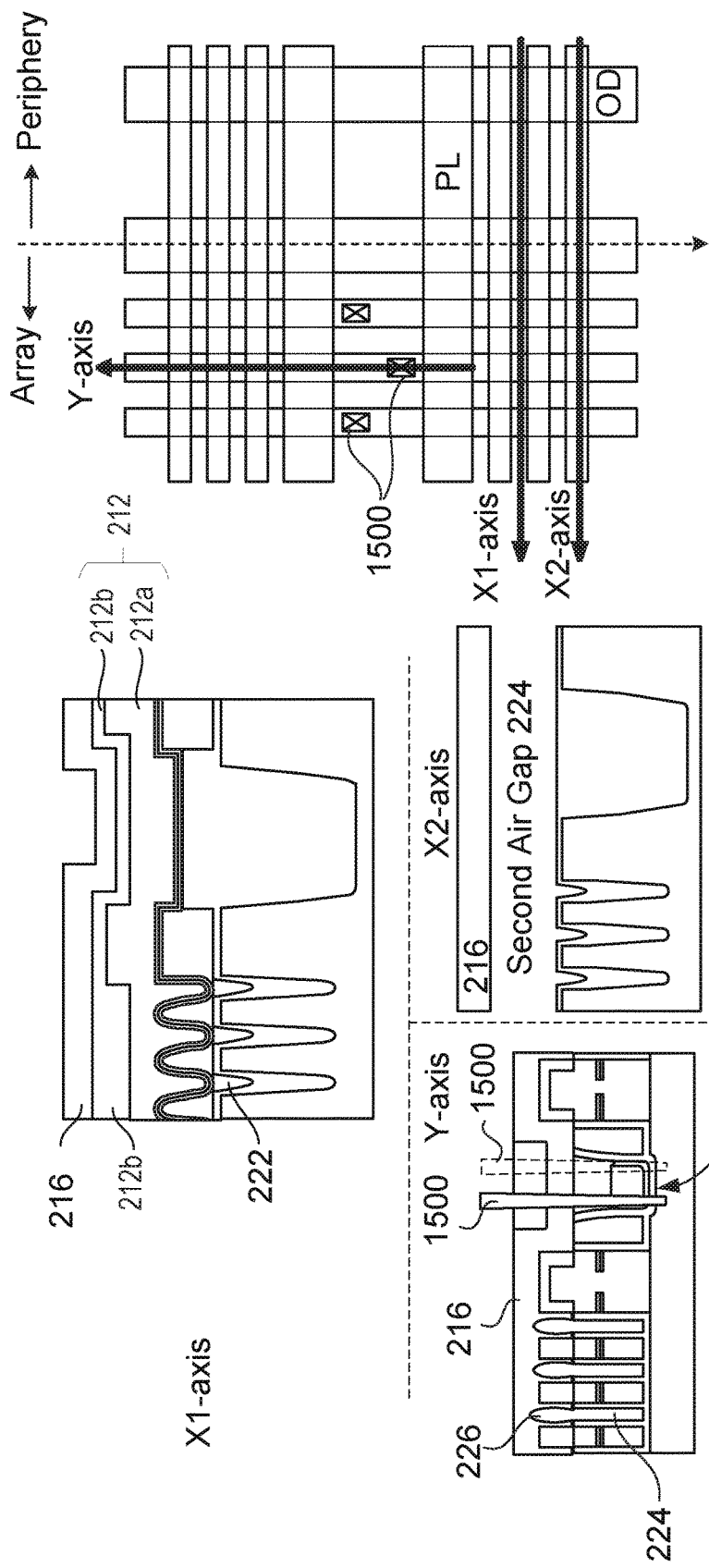

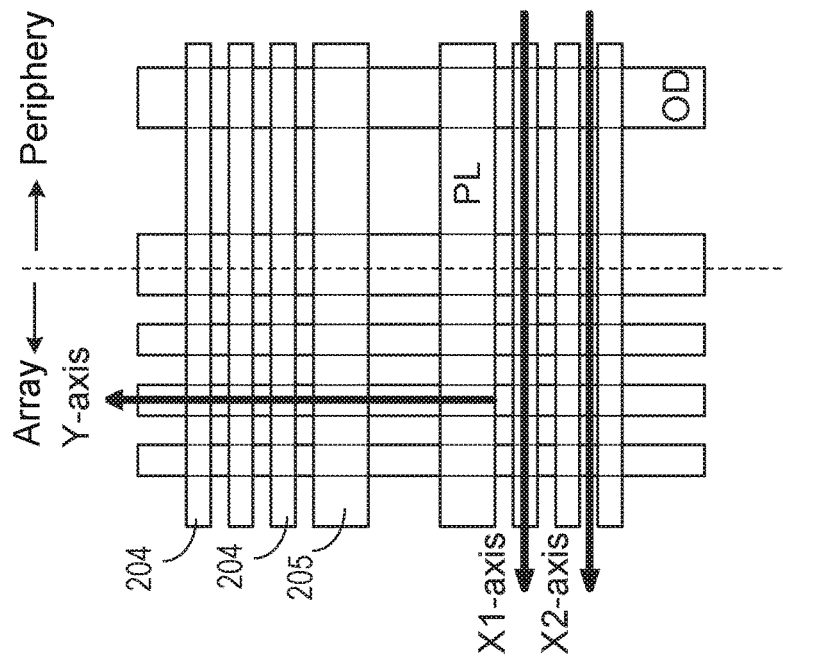
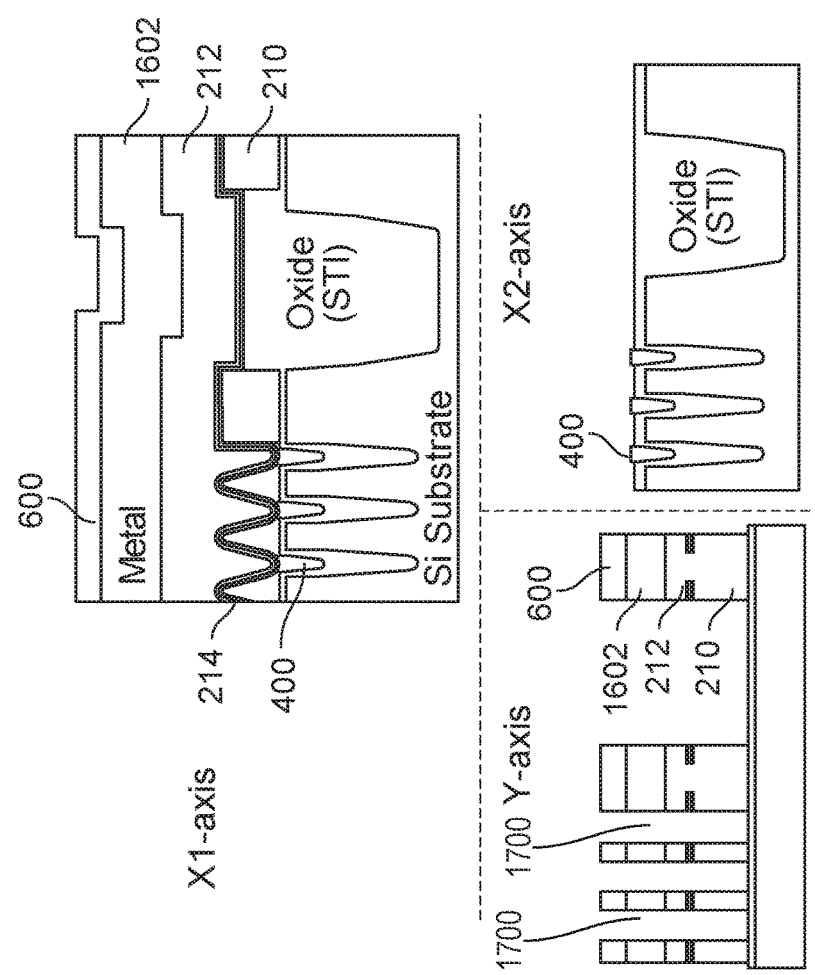
FIG. 17A
FIG. 17B

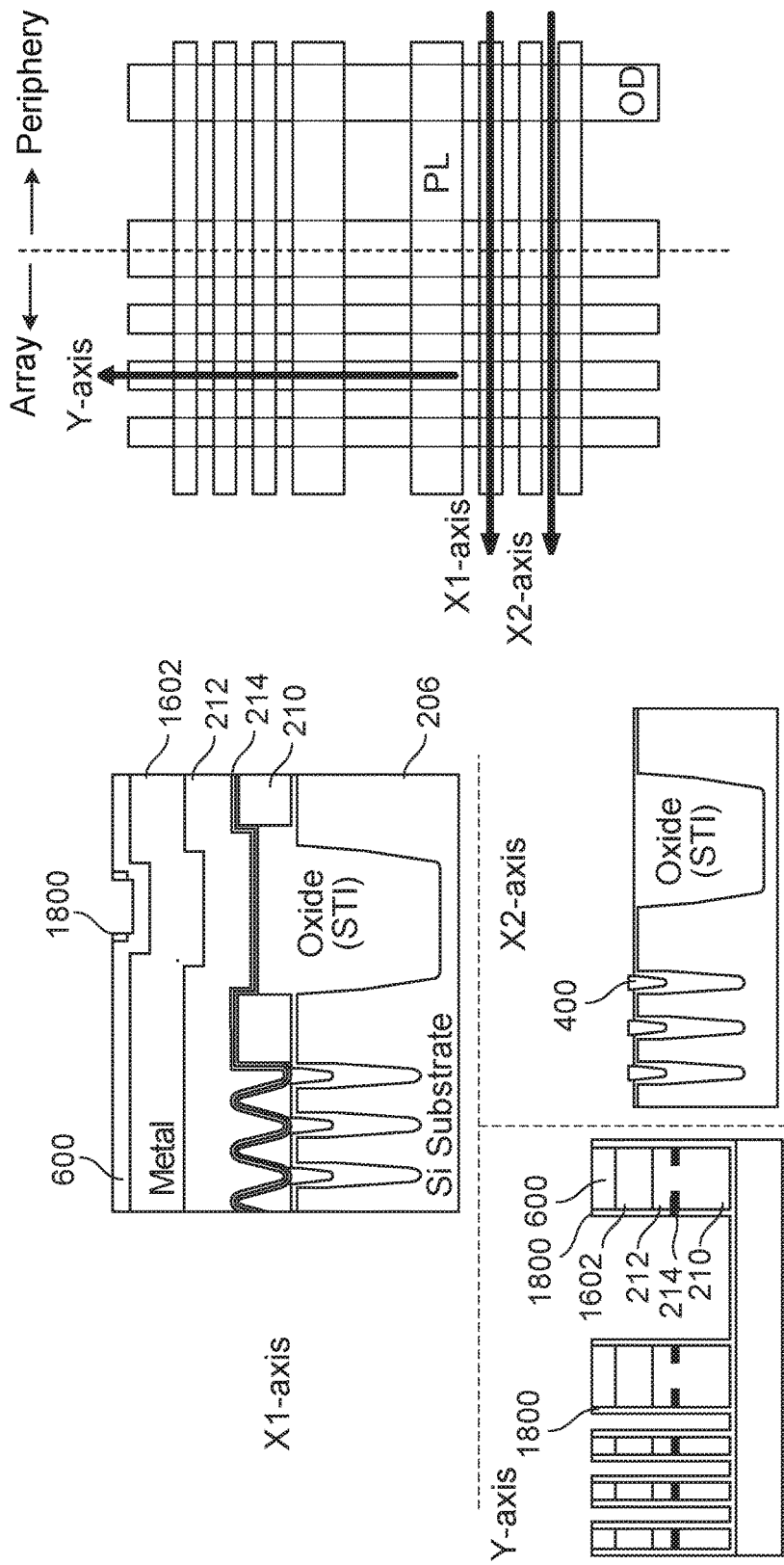

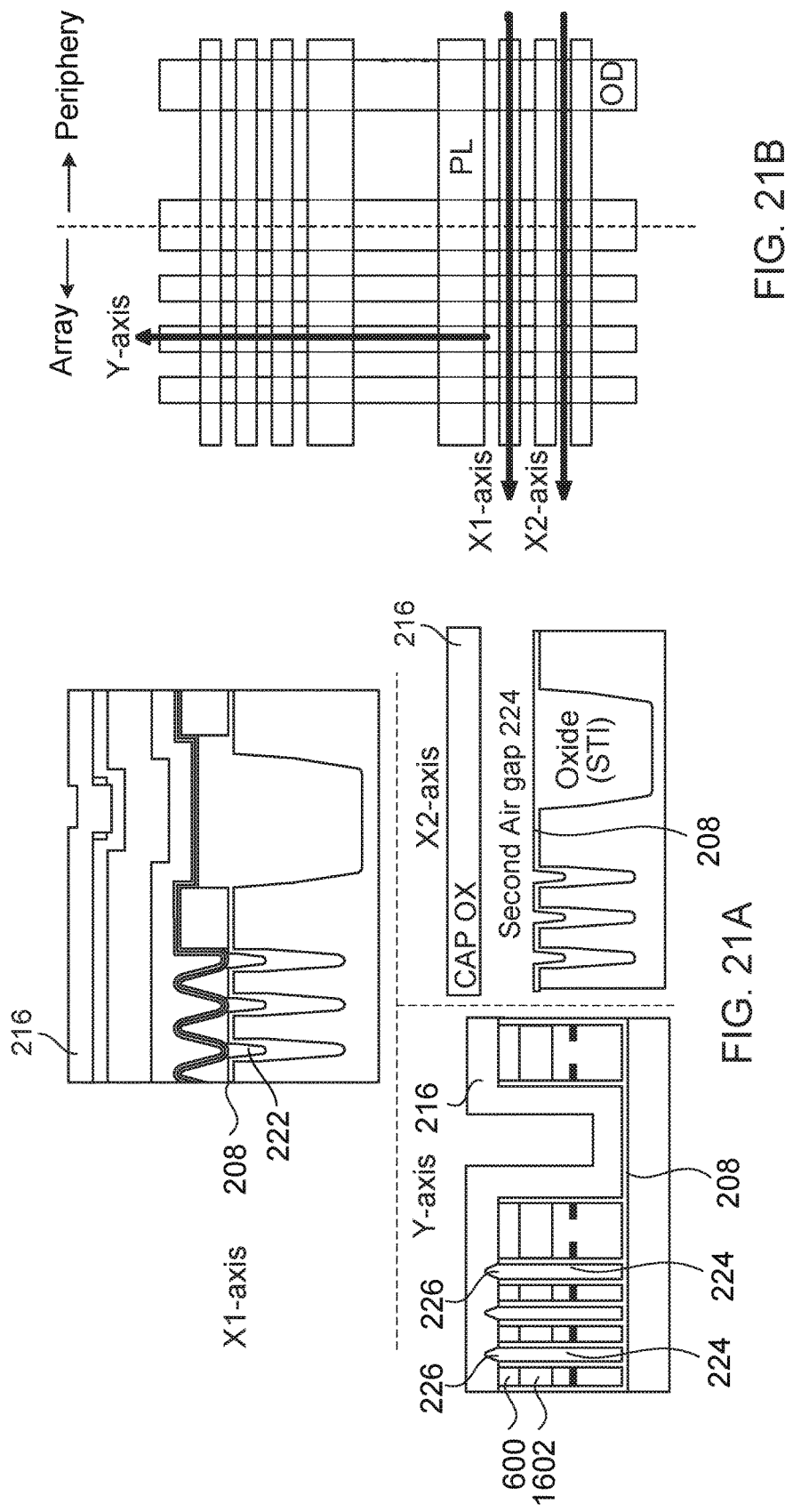

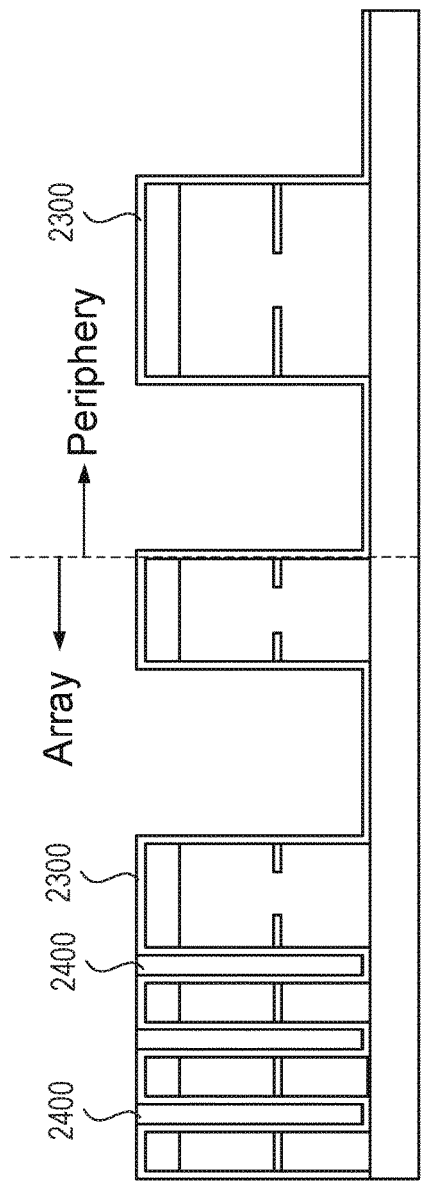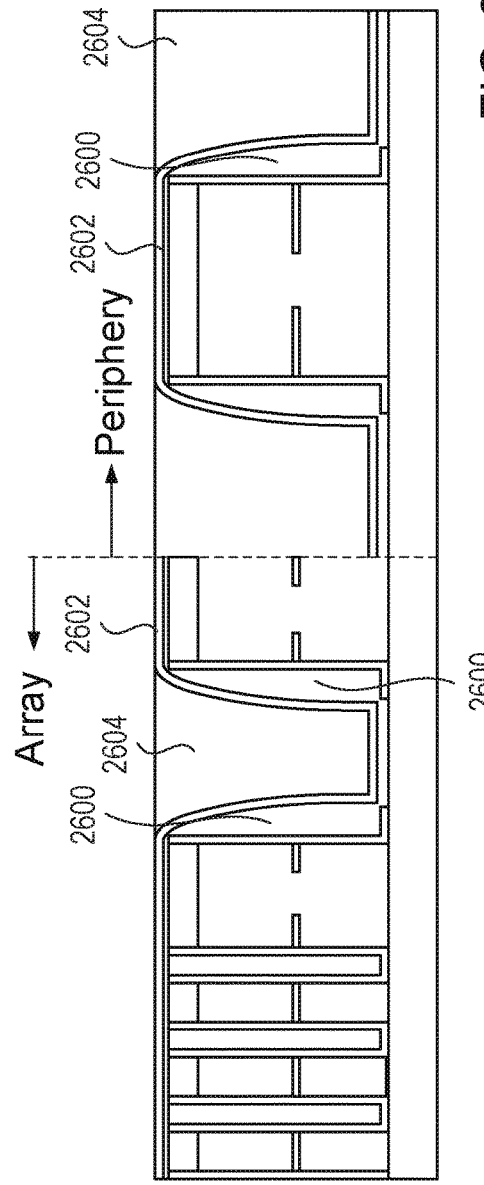

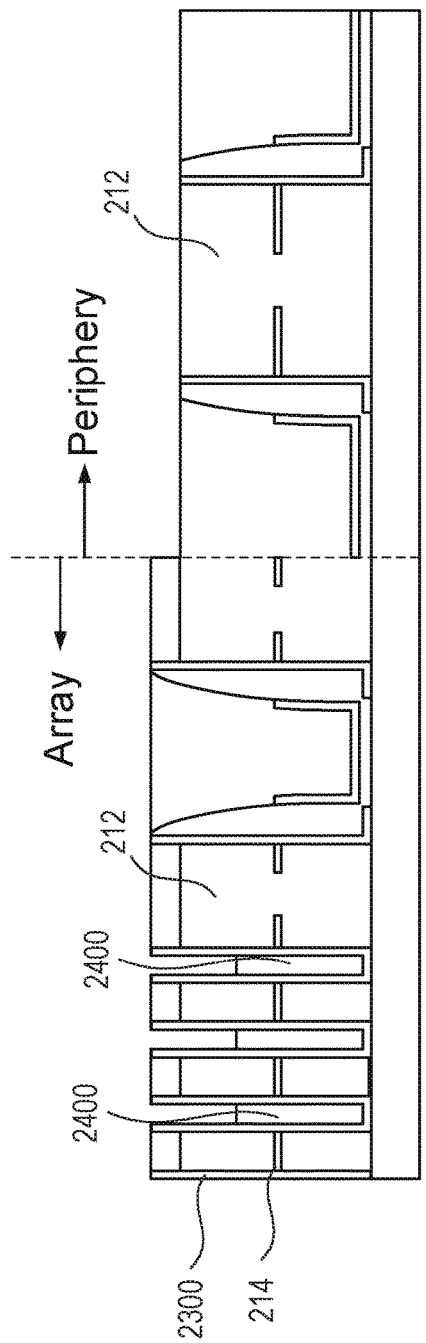
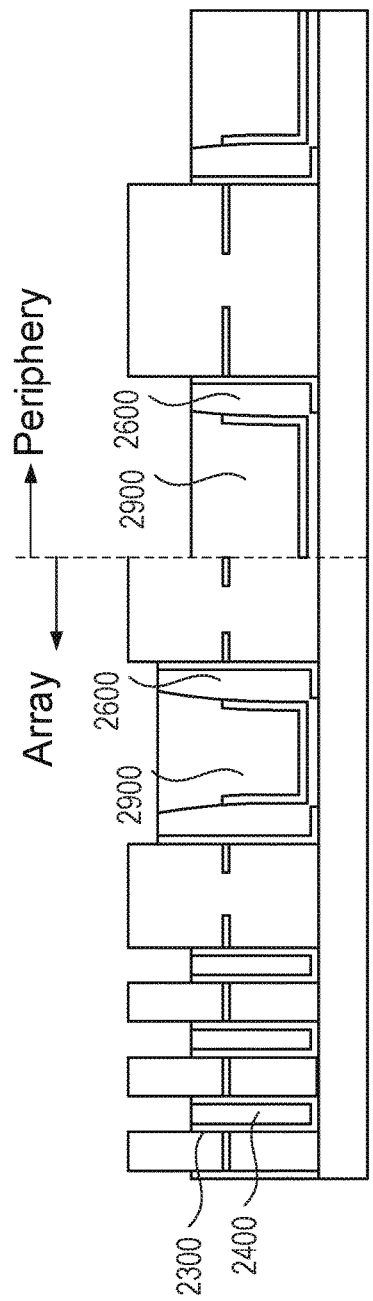

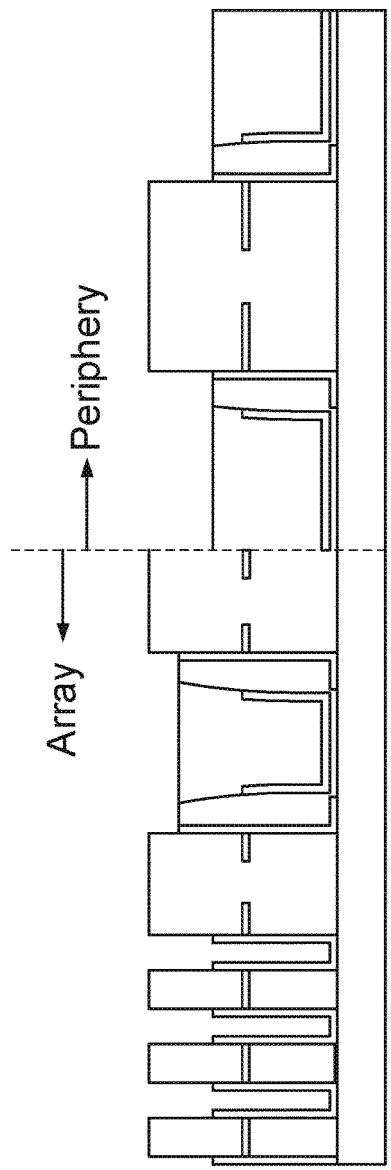
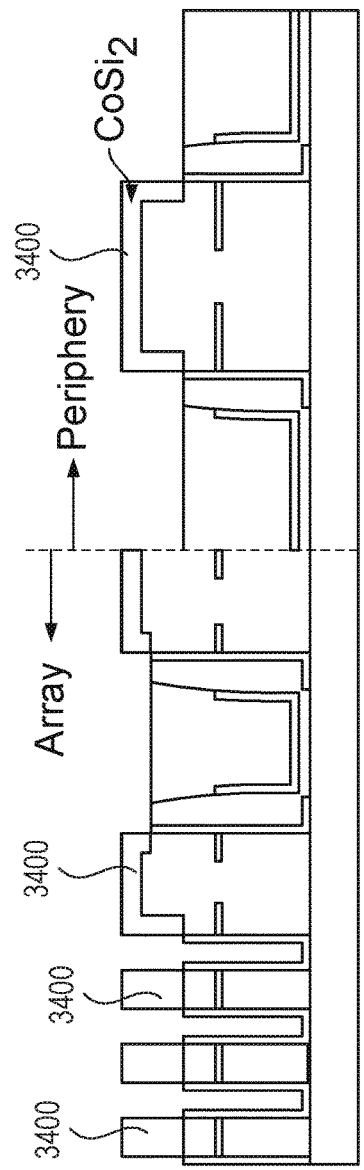

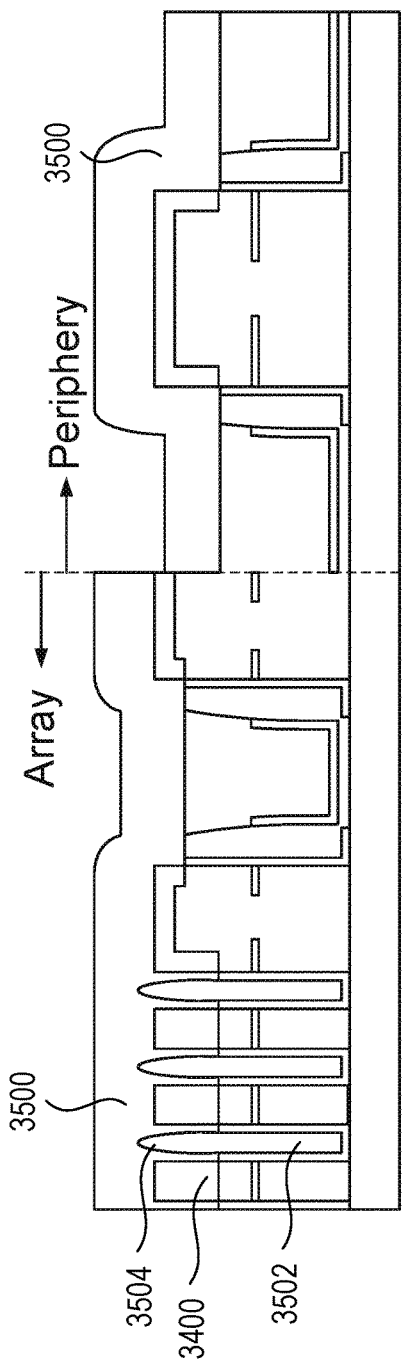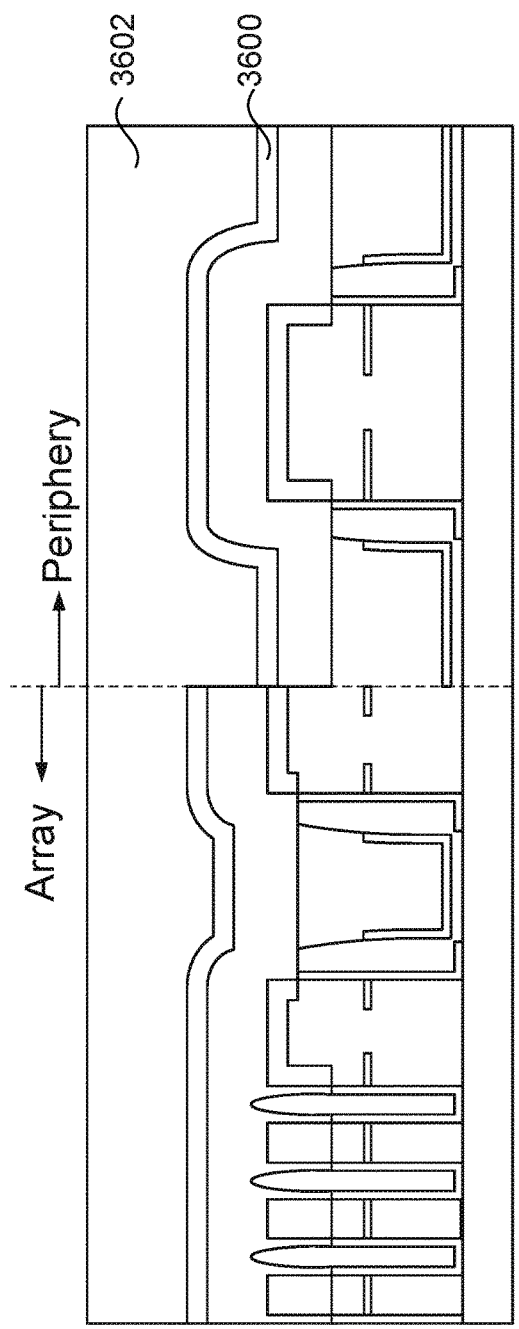

NON-VOLATILE SEMICONDUCTOR MEMORY

TECHNICAL FIELD

The present disclosure relates to non-volatile semiconductor memory.

BACKGROUND

In general, flash memory is electronic memory that is understood to include a solid-state non-volatile storage medium that can be electrically erased and reprogrammed, in flash memory, a memory cell includes a semiconductor channel region on which is formed a tunnel oxide layer and a gate electrode. In contrast to a typical metal-oxide semiconductor field effect transistor, the gate electrode of the flash memory can include two separate electrode layers (a floating gate and a control gate), which are separated from one another by an interlayer oxide region. To write to the memory cell, a voltage is applied such that the charge stored in the floating gate changes. The change in charge stored in the floating gate alters the threshold voltage $V_T$ of the memory cell.

SUMMARY

In general, in some aspects, the subject matter of the present disclosure covers semiconductor devices that include: a semiconductor substrate; multiple memory cells on the semiconductor substrate arranged along a first dimension and along a second dimension that is orthogonal to the first dimension, in which each memory cell of the multiple memory cells includes a channel region in the semiconductor substrate, a tunnel dielectric layer on the channel region, a first electrode layer on the tunnel dielectric layer, and in which, along the first dimension, and an inter-electrode dielectric extending continuously across each memory cell of the plurality of memory cells along the first dimension, the channel region of each memory cell of the multiple memory cells is separated from the channel region of an adjacent memory cell of the multiple memory cells by a corresponding first air gap, each first air gap extending from below an upper surface of the semiconductor substrate to the inter-electrode dielectric layer, in which the first air gap extends from below the upper surface of the semiconductor substrate up to and beyond an upper surface of the tunnel dielectric layer, and has a height of about 23 nm or less from a bottom surface of the inter-electrode dielectric layer to the upper surface of the semiconductor substrate.

Implementations of the semiconductor devices may include one or more of the following features. For example, in some implementations, at each first air gap, a bottom surface of the inter-electrode dielectric is exposed to the first air gap, and in which each memory cell of the multiple memory cells further includes a second electrode layer on the inter-electrode dielectric. In some implementations, the second electrode layer includes a first electrically conductive layer on the inter-electrode dielectric and a second electrically conductive layer on the first electrically conductive layer, the second electrically conductive layer includes a silicide, and a ratio of a thickness of the second electrically conductive layer to a thickness of the first electrically conductive layer is between about 2:1 to about 4:1. In some implementations, the second electrode layer includes a first electrically conductive layer on the inter-electrode dielectric and a second electrically conductive layer on the first electrically conductive layer, the second electrically conductive layer includes a metal, and a ratio of a thickness of the second electrically conductive layer to a thickness of the first electrically conductive layer is between about 2:1 to about 2:3.

In some implementations, the semiconductor devices further include a cap dielectric extending continuously across each memory cell of the multiple memory cells, in which, along the second dimension, the first electrode layer, the inter-electrode dielectric, and the second electrode layer of each memory cell of the multiple memory cells are separated from an adjacent memory cell by a corresponding second air gap, each second air gap extending into the cap dielectric to form a distinct recessed region in the cap dielectric. The second electrode layer may include a first electrically conductive layer on the inter-electrode dielectric and a second electrically conductive layer on the first electrically conductive layer, and the second electrically conductive layer includes a silicide, in which a depth to which each second air gap extends into the cap dielectric from a plane that is co-planar with an upper surface of the second electrode, is between about 8 nm and about 12 nm. Alternatively, the second electrode layer may include a first electrically conductive layer on the inter-electrode dielectric and a second electrically conductive layer on the first electrically conductive layer, and the second electrically conductive layer includes a metal, in which a depth to which each second air gap extends into the cap dielectric from a plane that is co-planar with an upper surface of the second electrode, is greater than about 8 nm.

In general, in another aspect, the subject matter of the present disclosure may encompass semiconductor devices including: a semiconductor substrate; multiple memory cells on the semiconductor substrate, the multiple memory cells being arranged along a first dimension and along a second dimension that is orthogonal to the first dimension, each memory cell of the multiple memory cells comprising a tunnel dielectric layer on the semiconductor substrate, a first electrode layer on the tunnel dielectric layer, an inter-electrode dielectric on the first electrode layer, a second electrode layer on the inter-electrode dielectric; a cap dielectric layer on the multiple memory cells; multiple first air gaps, each first air gap of the multiple first air gaps being formed within the semiconductor substrate and extending along the first dimension to separate adjacent columns of memory cells along the second dimension, in which each first air gap of the multiple first air gaps has a height of about 23 nm or less between an exposed bottom surface of the inter-electrode dielectric and a plane that is co-planar with an upper surface of the semiconductor substrate; and multiple second air gaps, each second air gap of the multiple second air gaps extending along the second dimension to separate adjacent rows of memory cells along the first dimension.

Implementations of the semiconductor devices may include one or more of the following features. For example, in some implementations, for each row of memory cells, the inter-electrode dielectric extends, along the second dimension, continuously across each memory cell within the row, and has a bottom surface exposed to the multiple first air gaps.

In some implementations, the second electrode layer includes a first electrically conductive layer on the inter-electrode dielectric and a second electrically conductive layer on the first electrically conductive layer, the second electrically conductive layer includes a silicide, and a ratio of a thickness of the second electrically conductive layer to a thickness of the first electrically conductive layer is between about 2:1 to about 4:1.

In some implementations, the second electrode layer includes a first electrically conductive layer on the inter-electrode dielectric and a second electrically conductive layer on the first electrically conductive layer, the second electrically conductive layer includes a metal, and a ratio of a thickness of the second electrically conductive layer to a thickness of the first electrically conductive layer is between about 2:1 to about 2:3.

In some implementations, along the second dimension, the first electrode layer, the inter-electrode dielectric, and the second electrode layer of each memory cell of the multiple memory cells are separated from an adjacent memory cell by a corresponding second air gap, each second air gap extending into the cap dielectric to form a distinct recessed region in the cap dielectric. The second electrode layer may include a first electrically conductive layer on the inter-electrode dielectric and a second electrically conductive layer on the first electrically conductive layer, the second electrically conductive layer includes a silicide, and a depth to which each second air gap extends into the cap dielectric from a plane that is co-planar with an upper surface of the second electrode may be between about 8 nm and about 12 nm.

In some implementations, second electrode layer includes a first electrically conductive layer on the inter-electrode dielectric and a second electrically conductive layer on the first electrically conductive layer, the second electrically conductive layer includes a metal, and a depth to which each second air gap extends into the cap dielectric from a plane that is co-planar with an upper surface of the second electrode may be greater than about 8 nm.

In general, in another aspect, the subject matter of the present disclosure may be embodied in methods of fabricating a semiconductor memory device, the methods including: providing a semiconductor substrate including a tunnel dielectric layer on an upper surface of the semiconductor substrate and a first electrode layer on an upper surface of the tunnel dielectric layer; forming multiple first isolation regions within the semiconductor substrate and the tunnel dielectric layer, the multiple first isolation regions extending along a first dimension, each first isolation region separating adjacent bit lines arranged along a second dimension that is orthogonal to the first dimension; filling the multiple first isolation regions with a first sacrificial material; removing a portion of the first sacrificial material to leave a remaining portion of first sacrificial material; forming an inter-electrode dielectric on the upper surface of the first electrode layer and on an upper surface of the remaining portion of first sacrificial material; forming a second electrode layer on the inter-electrode dielectric; patterning the second electrode layer, the inter-electrode dielectric and the first electrode layer to multiple second isolation regions, the multiple second isolation regions extending along the second dimension, each second isolation region separating adjacent word lines arranged along the first dimension; and removing the remaining portion of first sacrificial material to form a first air gap having a height of about 23 nm or less that extends from a bottom surface of the inter-electrode dielectric layer to the upper surface of the semiconductor substrate.

Implementations of the methods may include one or more of the following features. For example, in some implementations, the methods further include: depositing a second sacrificial material in the multiple second isolation regions; removing a portion of the second sacrificial material from the second isolation regions such that a first section of the second electrode layer has a first thickness extending from the inter-electrode dielectric to an upper surface of the second sacrificial material, and a second section of the second electrode layer has a second thickness extending from the upper surface of the second sacrificial material to an upper surface of the second electrode layer; removing the second sacrificial material to form multiple second air gaps in the second isolation regions; and forming a cap dielectric on the second electrode layer.

In some implementations, the methods further include transforming the second section of the second electrode layer from a polysilicon to a silicide, in which a ratio of the second thickness to the first thickness is between about 2:1 to about 4:1. The multiple second air gaps may extend above an upper surface of the second electrode layer and partially into the cap dielectric, in which a depth to which each second air gap extends into the cap dielectric from a plane that is co-planar with the upper surface of the second electrode layer is between about 8 nm and about 12 nm.

In some implementations, forming the second electrode layer includes: depositing a polysilicon material on the upper surface of the inter-electrode dielectric; and depositing a metal layer on the polysilicon material, in which a ratio of a thickness of the metal layer to a thickness of the polysilicon material is between about 2:1 to about 2:3. The methods may further include forming a cap dielectric on the second electrode layer, in which the multiple second air gaps extend above an upper surface of the second electrode layer and partially into the cap dielectric, and in which a depth to which each second air gap extends into the cap dielectric from a plane that is co-planar with the upper surface of the second electrode layer is greater than about 8 nm.

The details of one or more embodiments are set forth in the accompanying drawings and the description below. Features and advantages will be apparent from the description, the drawings, and the claims.

BRIEF DESCRIPTION OF THE DRAWINGS

FIG. 2A is a schematic that illustrates a top view of an example of a portion of a memory cell array of a semiconductor device according to the present disclosure.

FIG. 2B is a schematic that illustrates a cross-sectional side view of the example memory cell array cut along the Y-axis in FIG. 2A.

FIG. 2C is a schematic that illustrates a cross-sectional side view of the example memory cell array cut along the X1-axis (e.g., along a word line of the memory cell array) in FIG. 2A.

FIGS. 3A-16B are schematics that illustrate cross-sectional side views and top views of an example manufacturing process for the example memory cell array in FIGS. 2A-2C.

FIGS. 17A-22B are schematics that illustrate cross-sectional side views and top views of an alternative example manufacturing process for the example memory cell array in FIGS. 2A-2C.

FIGS. 23-36 are schematics that illustrate an example manufacturing process for forming the contact regions of the example memory cell array in FIGS. 2A-2C.

DETAILED DESCRIPTION

Figure 1:
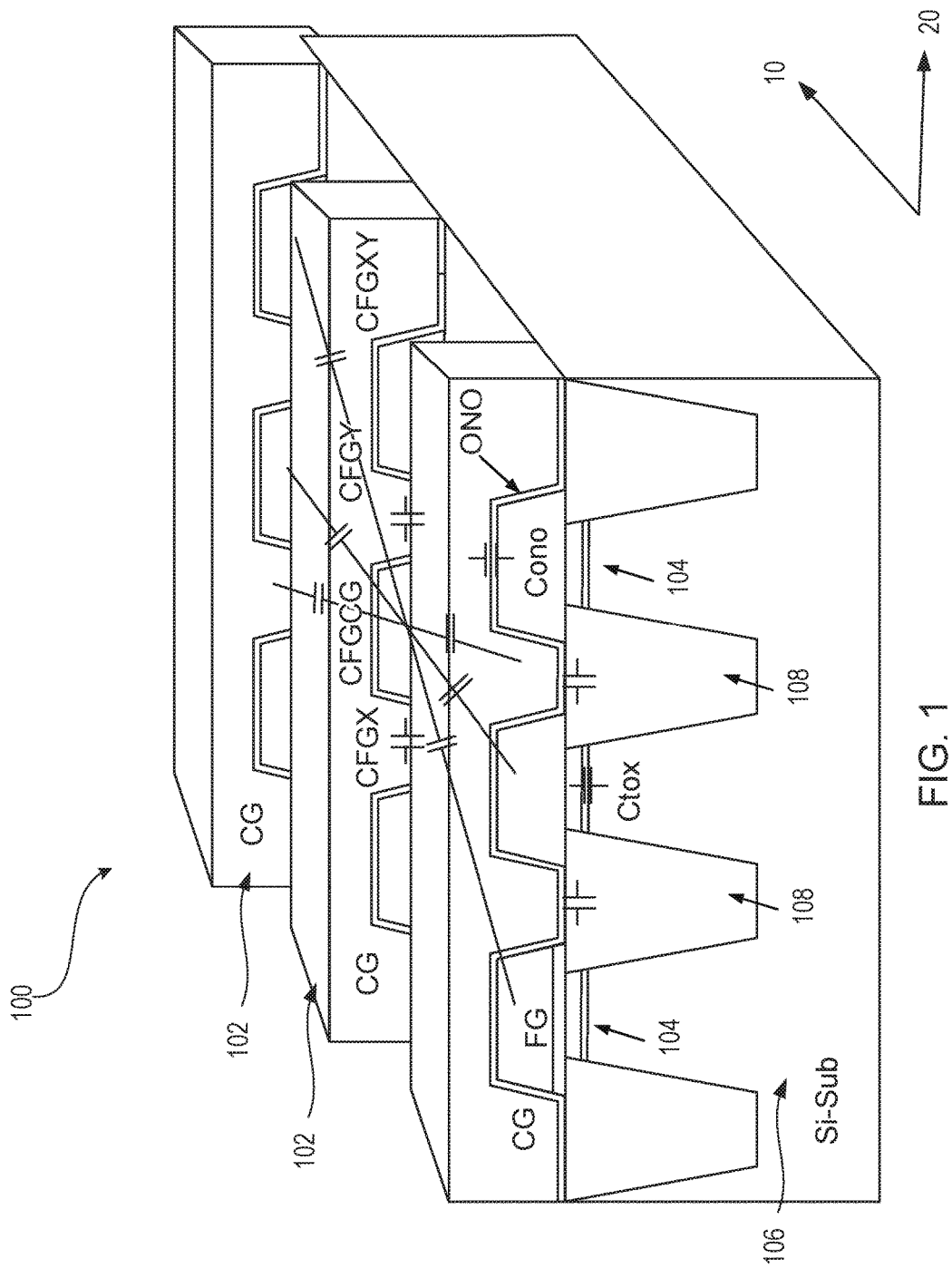
FIG. 1 is a schematic that illustrates a perspective view of a NAND-type flash memory array.

FIG. 1 is a schematic that illustrates a perspective view of a NAND-type flash memory array 100. The memory array 100 includes multiple word lines 102 arranged in parallel and spaced apart along a first direction 10 that serve as control gates (CG) for each memory cell. The array 100 also includes multiple active regions 104 within a substrate 106, in which the active regions extend in parallel and are spaced apart along a second direction 20 that is orthogonal to the first direction 10. The active regions 104 serve as bit lines for the memory cells. With this design, each memory cell may be understood to include a control gate, a floating gate (FG), and an inter-electrode dielectric (e.g., an oxide-nitride-oxide (ONO) layer). The active regions of adjacent memory cells are isolated from one another along the second direction by a trench isolation region 108.

For NAND flash operation, the threshold voltage (Vt) distribution and program disturbance are important factors for reliable and efficient operation of the memory cell array. However, as cell size decreases, cell-to-cell coupling interference can increase significantly, which causes wider Vt distribution due to a Vt shift by programming neighboring memory cells. Interference can come from, among other things, the capacitive coupling due to the oxide in the tunnel region (Ctox), capacitive coupling between the control gate and floating gate (CFGCG), capacitive coupling between adjacent floating gate electrodes (CFGX, CFGY, CFGXY), and capacitive coupling between floating gate electrodes and the substrate. To minimize this and other sources of interferences, certain dielectric materials within the memory cell array can be replaced with air gaps, given that air has a lower dielectric constant than a solid dielectric material (air has a dielectric constant of about 1).

FIG. 2A is a schematic that illustrates a top view of an example of a portion of a memory cell array 200 of a semiconductor device according to the present disclosure. FIG. 2B is a schematic that illustrates a cross-sectional view of the example memory cell array 200 cut along the Y-axis (e.g., along a bit line of the memory cell array 200) in FIG. 2A. FIG. 2C is a schematic that illustrates a cross-sectional view of the example memory cell array 200 cut along the X1-axis (e.g., along a word line of the memory cell array 200) in FIG. 2A. In the present example, the memory cell array 200 includes multiple NAND-type flash memory cells. However, the details set forth herein may be extended to other types of semiconductor components as well, such as NOR-type flash memory, logic devices, among other types of semiconductor components.

In FIG. 2A, multiple bit lines 202 are arranged in parallel and spaced apart along a first direction (e.g., the X1-axis), and each hit line 202 is elongated along a second direction (e.g., the Y-axis) that is orthogonal to the first direction. Multiple word lines 204 are arranged in parallel and spaced apart along the second direction, and each word line 204 is elongated along the first direction. The word lines 204 are formed above the bit lines 202 relative to the semiconductor substrate 206. Only a limited portion of the memory cell array is depicted in FIG. 2A. In the periphery area outside of the array, an active area may be provided in which electrical devices are formed for reading from and writing to the memory cells of the array.

In FIGS. 2B-2C, portions of multiple memory cell elements are shown, in which the memory cell elements include a semiconductor substrate 206. A dielectric layer 208 is provided on a surface of the semiconductor substrate 206. The dielectric layer 208 may be referred to as a tunnel dielectric layer and is positioned above channel regions 201 of the semiconductor substrate 206, as shown in FIG. 2C. The channel regions 201 include active areas of the semiconductor substrate 206. For example, the channel regions 201 may be doped with impurities to render the semiconductor material n-type or p-type, such that current may flow through the channel regions 201 upon the application of an appropriate voltage. The material of the semiconductor substrate 206 can include, for example, Si, Ge, SiGe, InP, Gals, GaN, GaInSnP, or ZnSe, among other materials. The material of the dielectric layer 208 can include, for example, an oxide (e.g., silicon dioxide), a nitride (e.g., silicon nitride), or an oxynitride, among other dielectric materials.

Above the dielectric layer 208, each memory cell includes a first electrode 210. The first electrode 210 is separated from the semiconductor substrate 206 by the dielectric layer 208. The first electrode 210 can be a floating gate electrode that serves as a charge storage layer. A second electrode 212 is provided above the first electrode 210. The second electrode 212 can be a control electrode that forms part of the word line. The material of the first electrode 210 can include, for example, polycrystalline silicon that is doped with an impurity to render the polysilicon either n-type or p-type. In some implementations, the first electrode 210 may be formed form other materials, such as metal, or polymetal films. Similarly, the material of the second electrode 212 can include, but is not limited to, polycrystalline silicon that is doped with an impurity to render the polysilicon either n-type or p-type, a metal, or a polymetal film.

The second electrode 212 is separated and electrically insulated from the first electrode 210 by an inter-electrode dielectric 214. In FIG. 2C, the inter-electrode dielectric 214 is shown to have an undulating pattern that covers the sidewalls of the first electrode 210. This undulating pattern allows the second electrode 212 to extend over the sides of the first electrode to improve the coupling between the floating gate and the control gate. The material of the inter-electrode dielectric 214 may include, for example, a stacked layer of dielectric films, such as alternating layers of silicon oxide, silicon nitride, and silicon oxide, also referred to as an ONO film. Other materials may be used as the inter-electrode dielectric 214 instead.

In some implementations, the second electrode 212 includes two layers of electrically conductive material. For example, a first layer 212a may include a first material, such as doped poly silicon, and a second layer 212b may include a second different electrically conductive material, such as a silicide (e.g., CoSi, NiSi, PtSi, WSi, or MoSi) or a metal or polymetal (e.g., Mo, Ti, W, Al, or Ta) that may have a lower resistivity than the first layer. A cap dielectric layer 216 is provided on an upper surface of the second electrode 212. The cap dielectric layer 216 extends continuously over the array 200 and between individual memory cells. The cap dielectric layer 216 can include dielectric materials, including but not limited to, silicon oxide. The cap dielectric layer 216 is omitted from FIG. 2A for clarity.

In FIG. 2C, trench isolation regions 218 are shown that separate adjacent channel regions 2011 from one another. The trench isolation regions 218 are spaced apart along the first direction (X-axis). Each trench isolation region 218 extends along the second direction (Y-axis) in parallel with the bit lines, and past multiple memory cells. The trench isolation regions 218 provide electrical isolation between the active areas of the adjacent channel regions 201. Each trench isolation region 218 includes a trench formed in the semiconductor substrate 206; the trench is filled with a dielectric 208. The material of the dielectric 208 can include, but is not limited to, an oxide, such as silicon oxide.

In FIG. 2C, the trench isolation regions 218 are shown to include recesses that form first air gaps 222. The first air gaps 222 extend downwardly from the upper surface of the dielectric 208 and can extend partially through the depth of the trench; a portion of the dielectric 208 can remain at the bottom of the trench. The presence of the first air gaps 222 reduces the dielectric constant, and thus the capacitance, between adjacent memory cells along the word line direction. The reduction in capacitance between memory cells can, in some implementations, reduce parasitic interference from neighboring cells, resulting in a reduced voltage threshold distribution. Furthermore, the presence of the first air gaps 222 can, in some implementations, reduce the fringe capacitance between the second electrode 212 and the semiconductor substrate 206, which improves the coupling ratio between the control gate and the floating gate, and allows a reduction in the write voltage necessary to write to the memory cell.

As shown in FIG. 2C, each of the first air gaps 222 extends from below an upper surface of the semiconductor substrate 206 up to and not beyond an upper surface of the dielectric layer 208. This results in each first air gap 222 extending to an exposed bottom portion of the inter-electrode dielectric 214. By limiting the height of the first air gaps 222 to no higher than the upper surface of the tunnel dielectric layer 208, it is possible, in some implementations, to provide greater control over the gate coupling ratio. In some implementations, the height of the first air gaps 222 extend above the upper surface of the dielectric layer 208. The height of the tunnel dielectric layer 208 from the upper surface of the semiconductor substrate 206 to the bottom portion of the inter-electrode dielectric may be, e.g., about 70 angstroms. The height of the air gap 22 up to the bottom portion of the inter-electrode dielectric may be, e.g., between about 120 angstroms to about 230 angstroms. For example, in some implementations, the height of the air gap 22 extending from a bottom surface of the inter-electrode dielectric 214 to the upper surface of the semiconductor substrate 206 may be within 23 nm or less.

In FIG. 2B, adjacent memory cells are also separated in the first direction by second air gaps 224. In particular, the second air gaps 224 isolate the first and second electrodes in each memory cell from the first and second electrodes in an adjacent memory cell. Second air gaps 224 are spaced apart along the second direction (Y-axis) and extend along the first direction (X-axis) in parallel with the word lines. A portion of the second air gaps 224 is formed in the dielectric layer 208, so a coating of the dielectric layer 208 can remain on the side walls of the first electrodes 110. The bottom of the second air gaps 224 can be substantially coplanar with the bottom of the first electrodes 210. A portion of the dielectric layer 208 can separate the second air gaps 224 from the semiconductor substrate 206. The second air gaps 224 are sealed at the top by the cap dielectric layer 216. In some implementations, the top portion of each second air gap 224 forms a distinct recessed region 226 within the cap dielectric layer 216. The presence of the second air gaps 224 reduces the dielectric constant, and thus the capacitance, between adjacent memory cells along the bit line direction.

As shown in FIG. 2A, the array 200 also may include contact regions 228 positioned along the bit lines. The contact regions 228 include several layers of dielectric material that cover the active area of a bit line, and through which a contact plug may be inserted for making contact to the active area.

It has been determined that it can be advantageous, in some implementations, to construct the memory cell devices described herein so that certain features have dimensions that fall within particular ranges. For example, when the second layer 212b of the second electrode 212 is formed from a silicide (e.g., from $CoSi_2$), the ratio of the thickness T2 of the second layer 212b to the thickness T1 of the first layer 212a of the second electrode 212 should be in a range of about 2:1 to about 4:1 to maintain a low resistance for the word lines and to maintain a high data retention for the memory cells. For instance, if the ratio of the thickness T2 of the second layer 212b to the thickness T1 of the first layer 212a falls below 2:1, the thickness T2 of the second layer 212b will be too thin relative to the first layer 212a, resulting in a resistance of the second electrode 212 that is too high for operation of the memory cell devices.

Additionally, should the ratio of the thickness T2 of the second layer 212b to the thickness T1 of the first layer 212a rise above 4:1, the thickness T2 of the second layer 212b becomes so high that it can damage the inter-electrode dielectric 214 (e.g., through conversion of portions of the dielectric into a silicide). A damaged inter-electrode dielectric 214 can reduce the data retention of the memory cell. Similarly, when the second layer 212b is formed from a metal (e.g., tungsten), the ratio of the thickness T2 of the second layer 212b to the thickness T1 of the first layer 212a of the second electrode 212 should be in a range of about 2:1 to 2:3 to maintain a low resistance for the word lines and to maintain a high data retention for the memory cells. The difference in the ratios for devices that contain the silicide as the second layer 212b and devices that use metals as the second layer 212b is due to the fact that silicides generally have higher resistances than metal. Thus, the thickness of second layer 212b should be thicker for silicides to obtain lower resistance than for metals.

In another example, the height/depth T3 of the recessed region 226 within the cap dielectric layer 216 should be between about 8 nm to about 12 nm to achieve a low capacitance between word lines when a silicide is used as the second layer 212b and greater than about 8 nm when a metal is used as the second layer 212b. T3 is determined as the distance of the second air gap 224 that extends from a plane co-planar with an upper surface of the second electrode to a lower surface of the cap dielectric layer 216. If the recessed region is less than about 8 nm, then the dielectric constant of the cap dielectric layer 216 dominates the capacitance, leading to substantial cross-talk, whereas if the recessed region is greater than about 12 nm (in the case silicides are used as the second layer 212b), the deposition rate of cap dielectric (e.g., an oxide) is relatively fast such that there is also likely to be an increase in the variation of film thickness and increase in the aspect ratio of contact. The increase in film thickness and aspect ratio variation makes these parameters non-uniform across the different memory cells, and can, in certain implementations, lead to unacceptable variations in operating parameters for the memory cells. In the case a metal is used for the second layer 212b, the upper limit on T3 depend instead on the thickness of the hard mask 600 remaining (see FIG. 21A).

The dimensions of the air gap may depend on the step coverage of the cap layer 216. Larger air gaps may be achieved as step coverage become poorer. The step coverage of 216 may be adjusted by tuning pressure or deposition rate of the cap layer material. The capacitance may also depend on the dielectric constant of the materials forming layer 208 and layer 216. In an example, the materials forming layer 208 and layer 216 have a dielectric constant of about 3.9.

In another example, for each first air gap 222, the height/depth T4 of the portion of the first air gap 222 extending above the substrate 206 should be between about 12 nm and about 23 nm to avoid substantially degrading the operation of the memory cell devices. T4 is, in particular, the distance corresponding to a portion of the first air gap 222 between a lower surface of the inter-electrode dielectric 214 and a plane that is co-planar with an upper surface of the substrate 206. T4 may correspond to the thickness of the tunnel dielectric layer 208 between the substrate 206 and the electrode 210. If T4 is less than about 12 nm, then the control gate to substrate breakdown voltage will degrade (e.g., diminish in value). If T4 is greater than about 23 nm, then the peak to peak height of the inter-electrode dielectric 214 is reduced, which, in turn, reduces the gate coupling ratio, and thus diminishes the controllability of the control gate to the floating gate. The precision of the values and ranges disclosed herein are limited in terms of the accuracy of the technique with which the values may be measured or inferred. For instance, in some implementations, the value T4 is determined based on the thickness of the tunnel dielectric 208 as extrapolated from the oxide deposition and/or etching process.

Figure 3B:
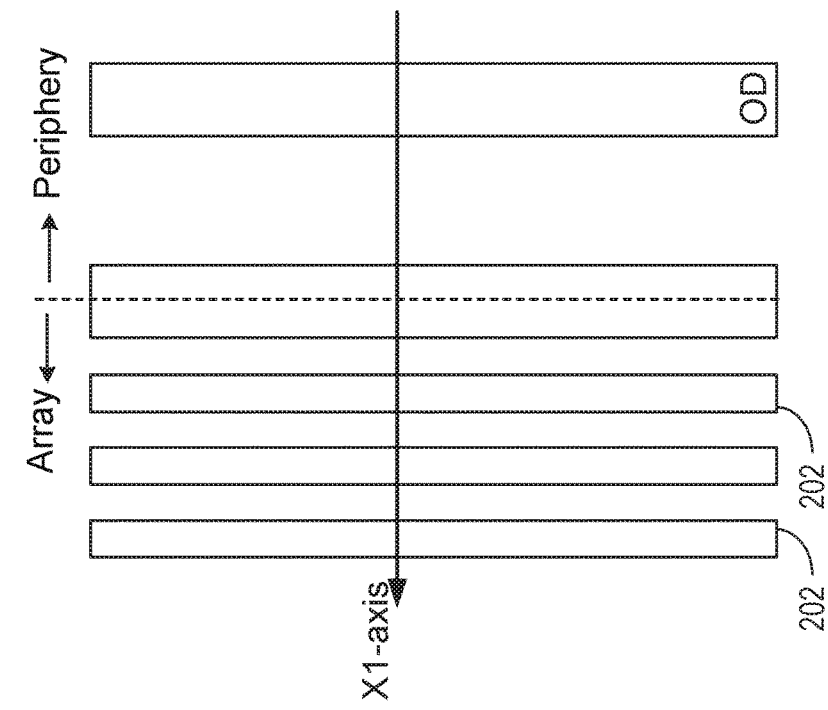
Figure 3A:
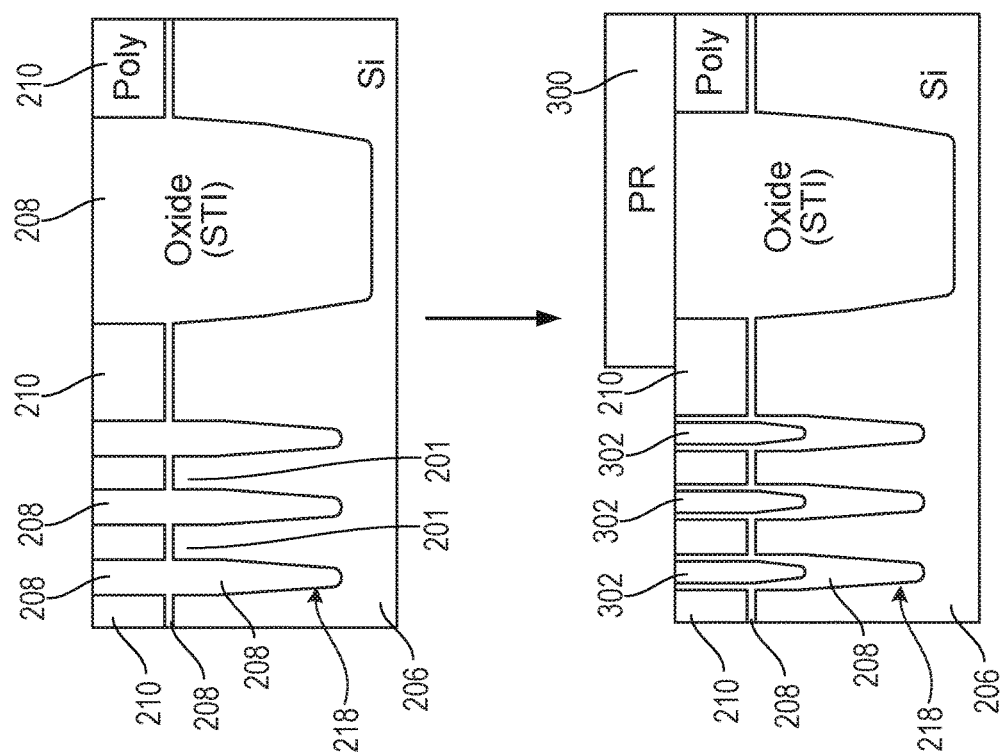

FIGS. 3A-16B are schematics that illustrate cross-section views and top views of an example manufacturing process for the example memory cell array shown in FIGS. 2A-2C. FIG. 3B is a top view of the semiconductor substrate 206. FIG. 3A is a cross-section view along the X1-axis of FIG. 3B.

As shown in FIGS. 3A-3B, a semiconductor substrate 206, such as a silicon substrate, is provided, in which the substrate 206 includes multiple shallow trench isolation (STI) regions 218. The trench isolation regions 218 electrically isolate adjacent channel regions 201 within the semiconductor substrate 206. The channel regions 201 include active areas of the semiconductor substrate 206. For example, the channel regions 201 may be doped with impurities to render the semiconductor material n-type or p-type, such that current may flow through the channel regions 201 upon the application of an appropriate voltage. The channel regions 201 correspond to the bit lines shown in FIG. 3B. Each trench isolation region 218 is filled with a dielectric material (e.g., silicon oxide) using a deposition method such as chemical vapor deposition (CVD). The dielectric material 208 that fills the trench isolation regions 218 also is formed on the upper surface of the semiconductor substrate 206. The portion of the dielectric 208 formed on the surface of the upper surface of the substrate 206 corresponds to the tunnel dielectric layer. The tunnel dielectric portion of material 208 may be formed using, e.g., thermal oxidation. The trench isolation regions 218 also extend into a first electrode layer 210 that is formed on the upper surface of the tunnel dielectric 208. The first electrode layer 210 may include an electrically conductive material, such as doped polysilicon ("poly"). The upper surface of the first electrode layer 210 and the exposed portion of the dielectric material 208 within the electrode layer 210 may be subject to chemical mechanical polishing to provide a flat and smooth surface.

After providing the substrate 206 having the trench isolation regions 218 and first electrode layer 210, a photoresist 300 is deposited and patterned on an upper surface of the first electrode layer 210. The photoresist 300 protects the periphery region but is removed in the array region to expose the dielectric 208. The exposed portions of the dielectric 208 then are etched, e.g., with an anisotropic etch (e.g., reactive ion etch (RIE)), to form openings 302 within the trench isolation regions 218. The openings 302 extend from the first electrode layer 210 through the tunnel dielectric layer and below the upper surface of the substrate 206. In some implementations, the sidewalls of the openings 302 retain the dielectric material 208.

Figure 4B:
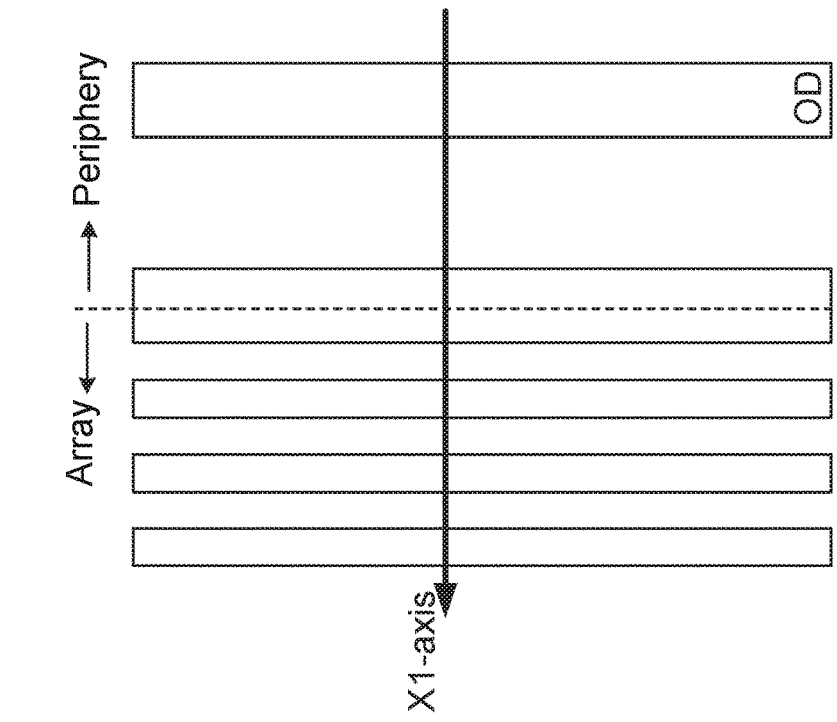
Figure 4A:
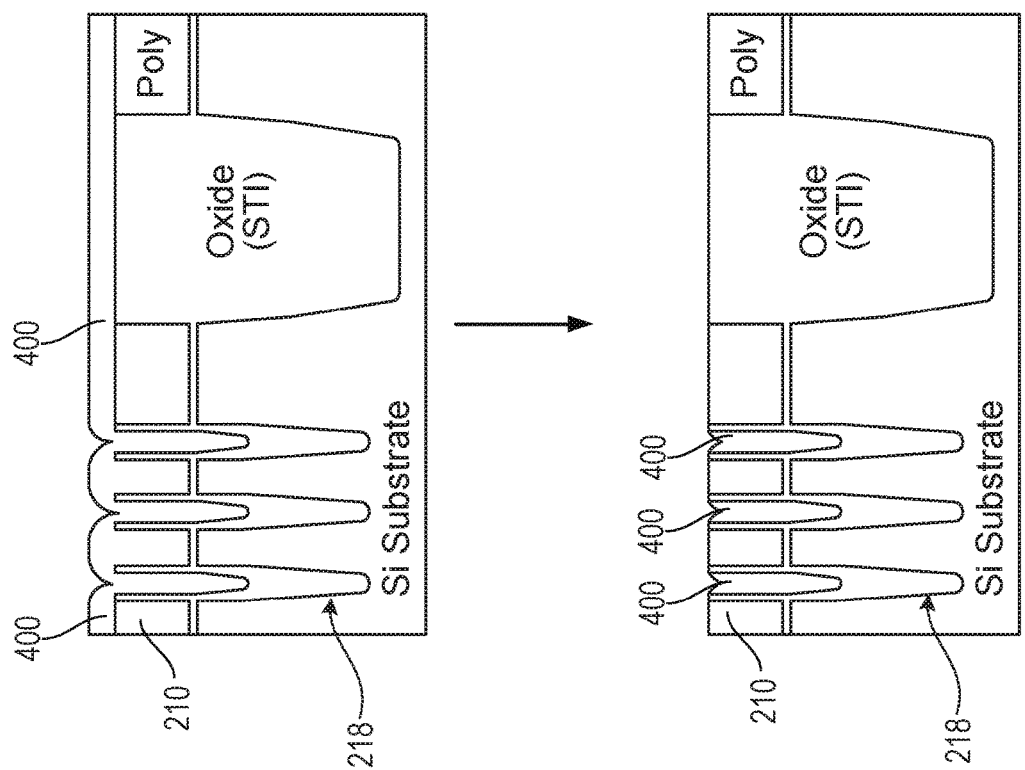

FIG. 4A is a cross-section view along the X1-axis of FIG. 4B and depicts a next step in the manufacturing process. As shown in FIG. 4A, the photoresist 300 is removed and a bit line sacrificial dielectric material 400 is deposited on an upper surface of the first electrode layer 210 in both the array and peripheral regions. The bit line sacrificial dielectric can include, e.g., silicon nitride and may be deposited using CVD. Other sacrificial material may be used instead, such as, e.g., spin-on dielectrics or other porous films. Following deposition of the sacrificial material 400, a portion of the material 400 is removed down to the upper surface of the first electrode layer 210. The material 400 may be etched using, e.g., a wet etch such as a solution of $H_3PO_4$. The unetched sacrificial material 400 remains within the openings 302 of the trench isolation regions 218.

FIG. 5A is a cross-section view along the X1-axis of FIG. 5B and depicts a next step in the manufacturing process. As shown in FIG. 5A, a photoresist layer 500 is deposited and patterned on an upper surface of the first electrode layer 210. The photoresist layer 500 protects the periphery region but is removed in the array region to expose the sacrificial dielectric 400 in the trench isolation regions 218.

The exposed sacrificial dielectric 400 is then subjected to an etch process that is highly selective for silicon oxide with respect to polysilicon. As a result, very little polysilicon from the first electrode layer 210 or dielectric 208 is removed during the etch process. The etch process that removes the sacrificial material 400 to form openings 502 and continues until the upper surface of the sacrificial material 400 is about even with the upper surface of the tunnel dielectric 208 that is located between the substrate 206 and the first electrode layer 210. The position of the bottom of opening 502 is based on the criteria of T4 described above. On the one hand, if the depth of 502 is deeper (resulting in a thinner T4), better gate coupling ratio may be achieved but this also may degrade the breakdown voltage of control gate to substrate. On the other hand, if the depth of 502 is shallower (resulting in a thicker T4), a higher breakdown voltage of control gate to substrate may be achieved but this may also degrade gate coupling ratio.

Following the etching of the sacrificial material 400, the photoresist 500 is removed and a fence removal etch is performed. The fence removal etch removes the dielectric 208 on the sidewalls of the first electrode layer 210. The etch can also removes a portion of the first electrode layer 210 resulting in the first electrode layer 210 having a hill-shaped curvature. Etching is stopped once the dielectric sidewalls are removed down to the sacrificial material 400.

Figures 6A, 6B:
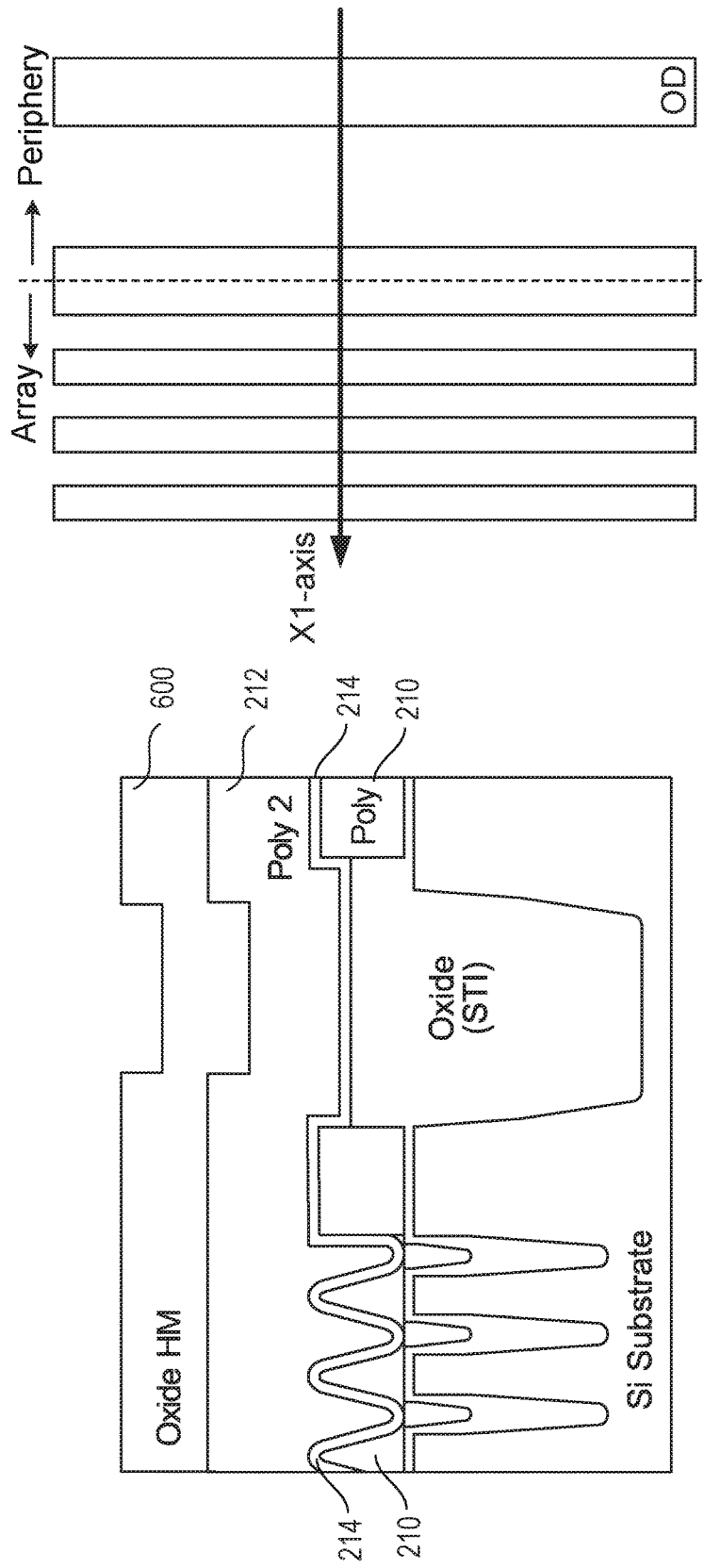

FIG. 6A is a cross-section view along the X1-axis of FIG. 6B and depicts a next step in the manufacturing process. As shown in FIG. 6A, an inter-electrode dielectric 214 is deposited on the upper surface of the first electrode layer 210. The inter-electrode dielectric 214 may include a multilayer film such as, e.g., silicon oxide-silicon nitride-silicon oxide. Because of the hill-shaped pattern of the first electrode layer 210, the inter-electrode dielectric 214 forms an undulating pattern that periodically comes into contact with the sacrificial material 400 within the trench isolation layers 218.

Following deposition of the inter-electrode dielectric 214, a second electrode 212 ("Poly 2") may be formed on the upper surface of the inter-electrode dielectric 214. The second electrode 212 may include, e.g., a conductive material such as doped polysilicon.

After depositing the polysilicon 212, a hard mask layer 600 (e.g., silicon oxide) is deposited on the upper surface of the polysilicon 212. The hard mask layer 600 protects the polysilicon 212, which forms the control gate of a memory cell, during a later polysilicon etch. The hard mask can be formed from material other than silicon oxide. The inter-electrode dielectric 214, polysilicon 212 and hard mask 600 are deposited over the entire surface of the array and peripheral regions.

FIG. 7A illustrates the next step in the manufacturing process using multiple cross-sectional views: a view along the X1-axis of FIG. 7B; a view along the X2-axis of FIG. 7B; and a view along the Y-axis of FIG. 7B. Multiple etches are performed in order to define the word lines 204 (narrow lines shown in FIG. 7B) and the active device drive lines 205 (wide lines in FIG. 7B). First, the hard mask 600 is patterned using photolithography and a dry etch to define the word lines 204 and drive lines 205 (also referred to as select line when used to control string current). That is, hard mask 600 is etched until portions of the second electrode 212 are exposed. Then, after defining the word lines and drive lines with the hard mask 600, the exposed regions of the second electrode 212 are etched to expose portions of the inter-electrode dielectric 214. The exposed portions of the inter-electrode dielectric 214 then are etched to expose portions of the first electrode 210. The exposed portions of the first electrode 210 then are etched down to the tunnel dielectric layer 208. By etching in this manner, openings 700 are formed between, and thus electrically isolate, adjacent memory cells along the Y-axis.

FIG. 8A illustrates the next step in the manufacturing process and depicts: a cross-sectional view along the X1-axis of FIG. 8B; a cross-sectional view along the X2-axis of FIG. 8B; and a cross-sectional view along the Y-axis of FIG. 8B. In this step, a buffer dielectric (e.g., a buffer silicon oxide) layer 800 is deposited on the upper surface of the hard mask 600 and on the exposed sidewalls of the openings 700 between adjacent memory cells (see, e.g., cross-sectional view along Y-axis) so that the buffer dielectric 800 covers the exposed portions of the first electrode layer 210, the inter-electrode dielectric 214 and the second electrode 212. By depositing the buffer dielectric layer 800 on the sidewalls of the memory cells, the buffer dielectric layer 800 protects the inter-electrode dielectric 214 from a later oxide etch step. The buffer dielectric 800 also is deposited on the upper surface of the tunnel dielectric layer 208 (see, e.g., cross-sectional view along X2-axis) so that the exposed portions of the sacrificial dielectric 400 are covered with the buffer dielectric.

Figures 9A, 9B:
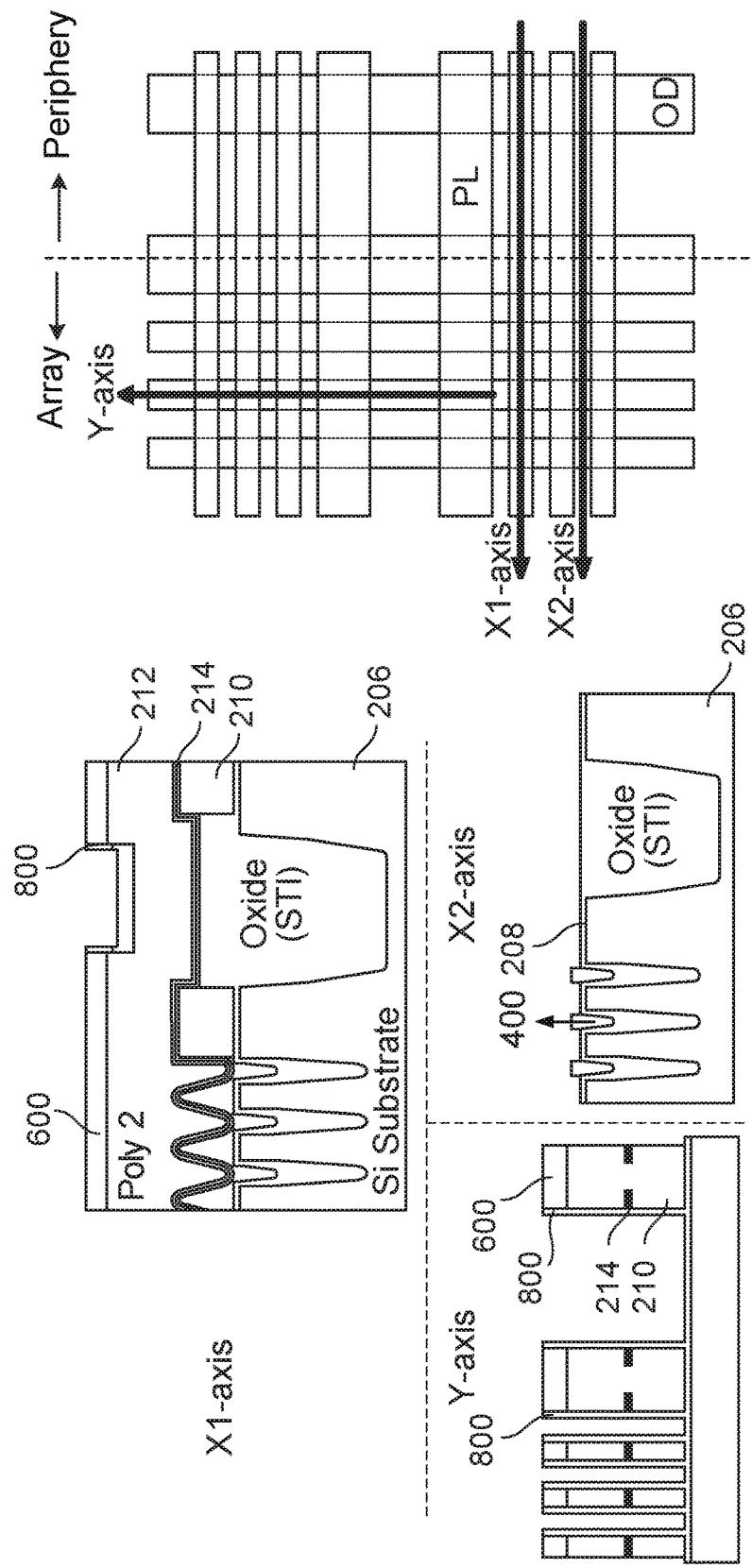

FIG. 9A illustrates the next step in the manufacturing process and depicts: a cross-sectional view along the X1-axis of FIG. 9B; a cross-sectional view along the X2-axis of FIG. 9B; and a cross-sectional view along the Y-axis of FIG. 9B. In this step, a portion of the buffer dielectric 800 is removed by etching (e.g., dry etching) to expose the upper surface of the sacrificial dielectric and the hard mask 600. A portion of the buffer oxide 800 remains, however, on the sidewalls of the memory cells to protect the inter-electrode dielectric 214. The dielectric 208 on the upper surface of the substrate 206 (see, e.g., X2-axis cross-sectional view) is to protect the substrate 206 from a later silicidation step.

FIG. 10A illustrates the next step in the manufacturing process and depicts: a cross-sectional view along the X1-axis of FIG. 10B; a cross-sectional view along the X2-axis of FIG. 10B; and a cross-sectional view along the Y-axis of FIG. 10B. In this step, a second sacrificial dielectric material (also referred to as a Write Line sacrificial dielectric material) 1000 is deposited over the array and peripheral regions. The second sacrificial dielectric material 1000 may include, e.g., silicon nitride. Other sacrificial material may be used instead, such as, e.g., spin on dielectrics or other porous films. The second sacrificial dielectric material 1000 fills exposed openings between adjacent word lines and bit lines.

Figures 11A, 11B:
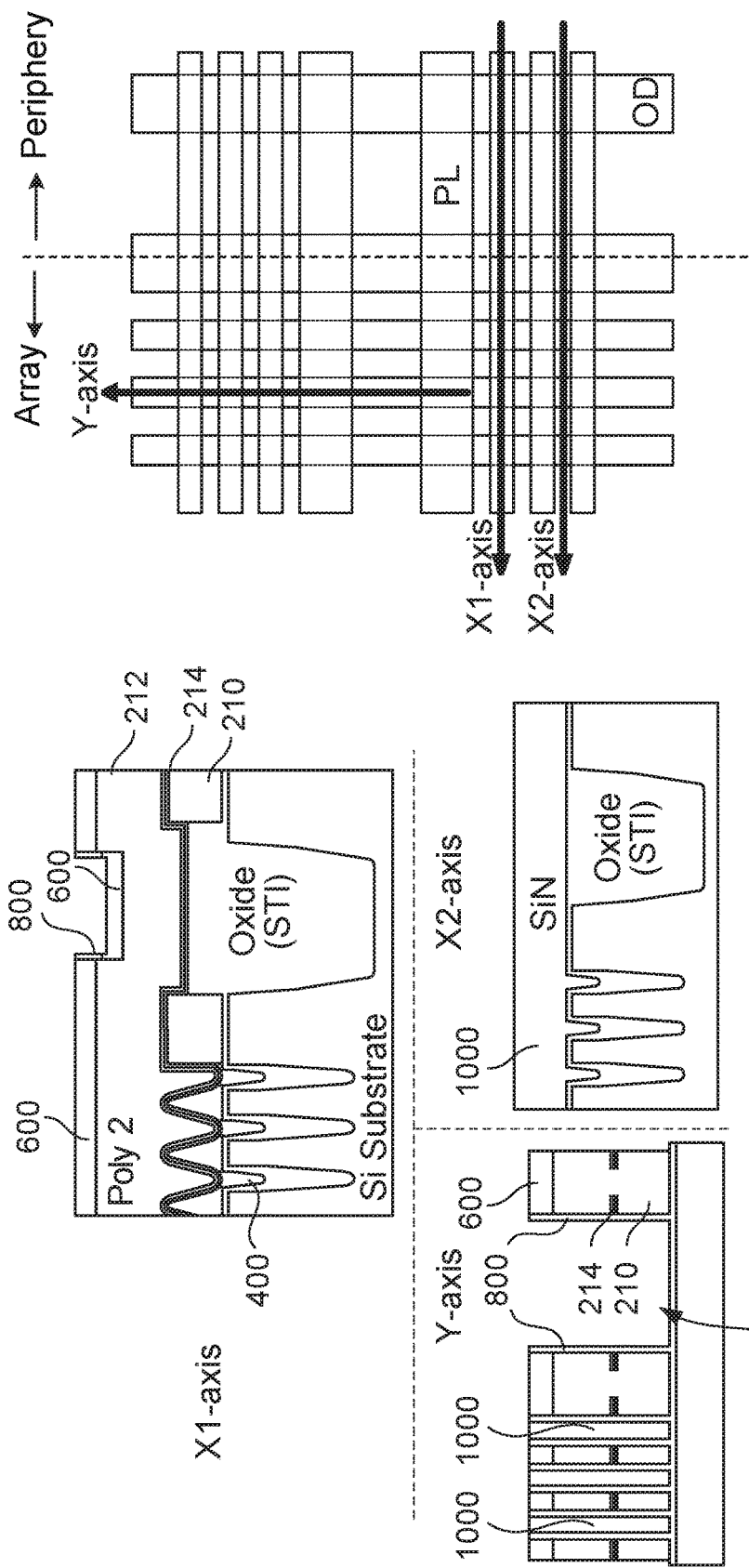

FIG. 11A illustrates the next step in the manufacturing process and depicts: a cross-sectional view along the X1-axis of FIG. 11B; a cross-sectional view along the X2-axis of FIG. 11B; and a cross-sectional view along the Y-axis of FIG. 11B. In this step, the second sacrificial dielectric material 1000 is subject to an etch (e.g., a wet etch such as $H_3PO_4$). Because the regions between word lines (see, e.g., cross-sectional view along Y-axis) are relatively narrow (e.g., less than about 40 nm), the second sacrificial dielectric material 1000 in those regions is not significantly etched. That is, the etching process (e.g., either a dry etch or wet etch such as $H_3PO_4$) cannot substantially penetrate into the area between the word lines such that the second sacrificial dielectric material 1000 remains in those regions. In other wider regions (e.g., between drive lines such as region 1100 as shown in the cross-sectional view along the Y-axis), the second sacrificial dielectric material 1000 is more easily removed.

Figures 12A, 12B:
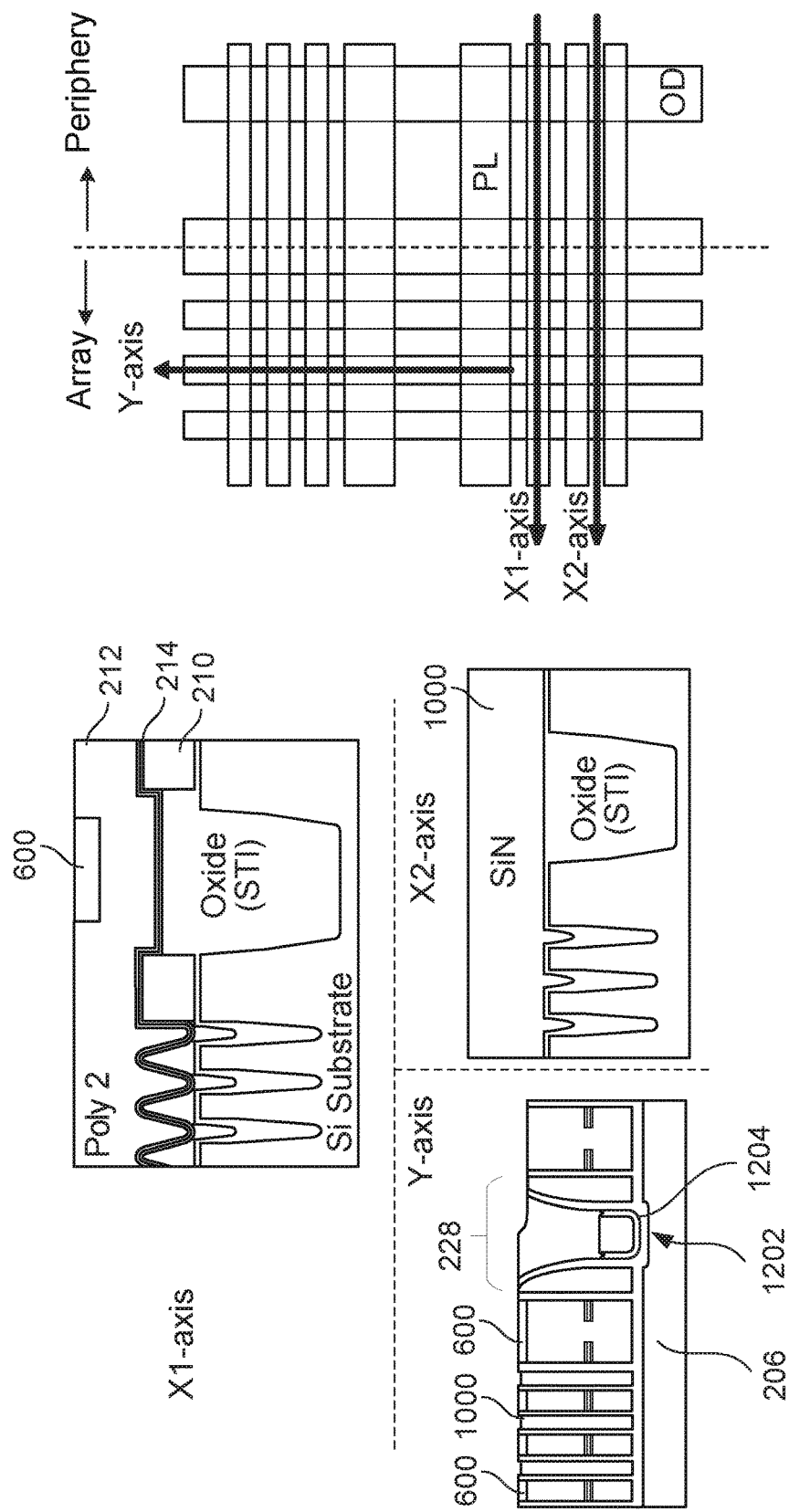

FIG. 12A illustrates the next step in the manufacturing process and depicts: a cross-sectional view along the X1-axis of FIG. 12B; a cross-sectional view along the X2-axis of FIG. 12B; and a cross-sectional view along the Y-axis of FIG. 12B. In this step, more of the hard mask 600 is removed and a spacer and interlayer dielectric process is performed to create a spacer/interlayer dielectric 228 for covering a substrate contact region 1202 to which electrical contact can be made. The spacer/interlayer dielectric 228 includes a sacrificial region 1204 that can be formed, e.g., from silicon nitride. As shown in the cross-sectional view along the Y-axis of FIG. 12A, the sacrificial region 1204 has a U-shaped structure, in which the uppermost portion of the U-shape extends no more than halfway to the upper part of the entire dielectric structure 228. The reason for forming the sacrificial region 1204 in this manner is so that, when the air gaps between bit lines and word lines are later formed in the fabrication process (through the removal of the sacrificial dielectrics), the removal of the sacrificial region 1204 does not result in a short-circuit between adjacent contacts, which might otherwise occur if the uppermost portion of the of the U-shaped sacrificial region extended close to or up to the upper part of the dielectric structure 228. Further details on an example of a process for forming a spacer/interlayer dielectric similar to the spacer/interlayer dielectric 228 are described herein with respect to FIGS. 23-37.

FIG. 13A illustrates the next step in the manufacturing process and depicts: a cross-sectional view along the X1-axis of FIG. 13B; a cross-sectional view along the X2-axis of FIG. 13B; and a cross-sectional view along the Y-axis of FIG. 13B. In this step, the hard mask 600 is removed (e.g., by dry etching). Furthermore, a portion of the second sacrificial dielectric material 1000 between the word lines also is removed, along with a portion of the fence dielectric that covers the second electrode 212. The purpose of removing a portion of both the sacrificial dielectric and the fence oxide that covers the sidewalls of the second electrode 212 is to expose the second electrode 212 (e.g., the control electrode) for a later metal silicide formation step.

FIG. 14A illustrates the next step in the manufacturing process and depicts: a cross-sectional view along the X1-axis of FIG. 14B; a cross-sectional view along the X2-axis of FIG. 14B; and a cross-sectional view along the Y-axis of FIG. 14B. In this step, the remaining second sacrificial dielectric material 1000 and sacrificial dielectric material 400 are removed. These materials can be removed using, e.g., a wet etchant solution that is capable of penetrating under the inter-electrode dielectric 214 to remove nitride in these areas. Alternatively, in some implementations, a dry etching process may be used to remove the sacrificial material. Removing the sacrificial dielectric material results in the formation of first air gaps 222 under the inter-electrode dielectric 214 and second air gaps 224 between adjacent memory cells. As shown in FIG. 14A (see, e.g., the cross-sectional view along the X2-axis), the second air gaps 224 extend co-parallel with the word lines between adjacent memory cells. The first air gaps 222 extend co-parallel with the bit lines between adjacent memory cells (see, e.g., the cross-sectional view along the X1-axis).

FIG. 15A illustrates the next step in the manufacturing process and depicts: a cross-sectional view along the X1-axis of FIG. 15B; a cross-sectional view along the X2-axis of FIG. 15B; and a cross-sectional view along the Y-axis of FIG. 15B. In this step, the second electrode 212 is modified to form a first conductive layer 212a and a second conductive layer 212b. The second conductive layer 212b includes a silicide material, such as, e.g., $CoSi_2$. The second electrically conductive layer 212b may include other silicides instead, such as, e.g., NiSi, PtSi, WSi, or MoSi. The silicide layer 212b is formed to reduce the resistance of the second electrode 212. A cap dielectric layer 216 is formed on an upper surface of the silicide layer 212b.

To form the silicide layer 212b, a layer of material (e.g., Co) is deposited on top of the second electrode 212. Then, the cap dielectric material is deposited on the upper surface of the Co (or on any other suitable material that is used to form the silicide). For example, the cap dielectric material may include a plasma enhanced chemical vapor deposition silicon oxide that is annealed at a high temperature. The high temperature anneal causes the Co (or other suitable material used to form the silicide) to diffuse into and bond with Si in the polysilicon layer 212. This diffusion and bonding process results in the silicide layer 212b, with the remaining portion of the electrode 212 left as polysilicon. The diffusion and silicidation process is controlled so that ratio of the thickness of the silicide layer 212b to the thickness of the remaining polysilicon layer 212a of the second electrode 212 is between about 2:1 to about 4:1 to maintain a low resistance for the word lines and to maintain a high data retention for the memory cells.

Additionally, because the distance between adjacent memory cells is relatively narrow (e.g., less than about 40 nm), and because the step coverage of the deposited cap layer dielectric 216 is relatively poor, the cap layer dielectric joins together with adjacent cap layer dielectric material over the second air gaps 224, essentially forming a bridge of dielectric material over the air gaps 224 (see, e.g., the cross-sectional views along the Y-axis and along the X2-axis). The bridged regions of the cap dielectric material 216 also lead to the formation of recessed regions 226.

The thickness of the cap dielectric material 216 above the recessed regions is thinner than above the second electrode 212. The thickness of the cap dielectric 216 is fabricated such that the height/depth of the recessed region 226 within the cap dielectric layer 216 is between about 8 nm to about 12 nm to achieve a low capacitance between word lines. That is, the thickness of the recessed region 226, as determined from the top of control gate (i.e., a plane that is co-planar with the upper surface of the layer 212b in this example) to the top of the second air gap 224 is between about 8 nm and about 12 nm. If the thickness of the recessed region 226 the air gap is less than about 8 nm, this will degrade the breakdown voltage and enhance coupling effect between adjacent memory cells. If the thickness of the recessed region 226 is greater than about 12 nm, this means the deposition rate of cap oxide is relatively fast such that there is also likely to be an increase in the variation of film thickness and increase in the aspect ratio of contact, making these parameters non-uniform across the different memory cells, and leading to unacceptable variations in operating parameters for the memory cells.

Although the foregoing process depicts removing the sacrificial material prior to the formation of the silicide layer, it is possible to instead remove the sacrificial material after formation of the silicide layer.

Contact probes 1500 are then inserted into the contact regions 228 to make contact to the active area.

The implementation show and described with respect to FIGS. 2A-2C includes a second electrode 212 formed from a polysilicon layer 212a and a silicide layer 212b, in which the silicide layer helps reduce the resistance of the second electrode 212 (e.g., when the second electrode 212 is used as a control electrode of a flash memory cell). In some implementations, the second electrode 212 can include an electrically conductive material that is different from the silicide layer 212b. For example, in some implementations, the second electrode 212 may include the first electrically conductive layer that is formed from polysilicon and a second electrically conductive layer that is formed from metal. Replacing the silicide with a metal may, in some implementations, simplify the fabrication process and reduce the control gate resistance further. FIGS. 16A-FIG. 21B are schematics that illustrate an example process for forming a second electrically conductive layer of a second electrode from a metal.

Figures 16A, 16B:
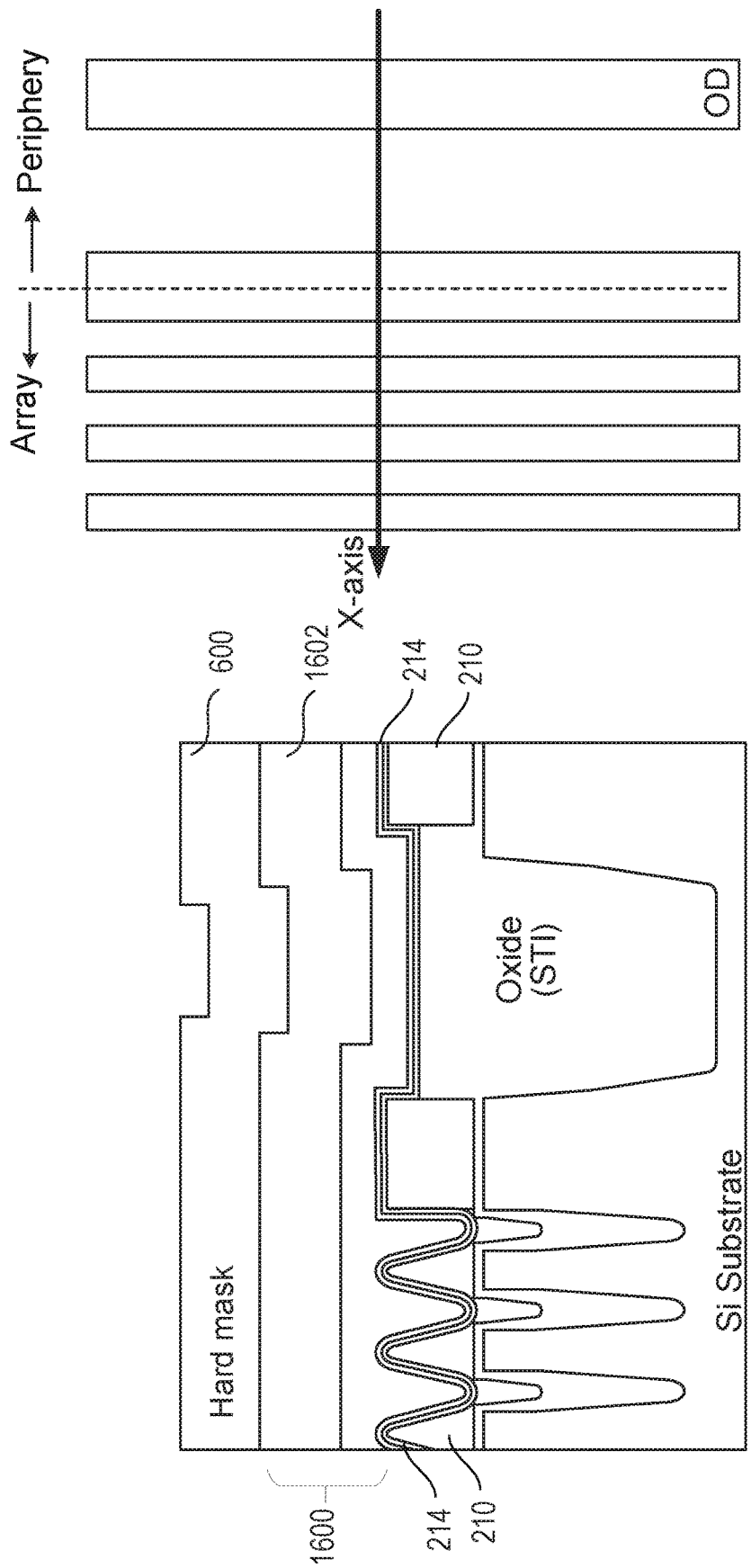

The process depicted in FIGS. 16A-16B begins following the patterning of the first electrode layer 210 shown in FIGS. 5A-5B. In particular, FIG. 16A is a schematic that illustrates a cross-sectional view along the X1-axis in FIG. 16B. FIG. 16B is a top view of the array and peripheral regions of the device. As shown in FIG. 16A, a metal layer 1602 is deposited on the upper surface of the second electrode, followed by the hard mask 600 being deposited on the upper surface of the metal layer 1602. The metal layer 1602 and electrode 212 together may correspond to a new electrode 1600. The metal layer 1602 may include a metal such as, e.g., Mo, Ti, W, Al, or Ta. Other metals may be used instead. The thickness of the metal layer 1602 and the thickness of the second electrode 212 is controlled ratio of the thickness of the metal layer 1602 to the thickness of the polysilicon electrode 212 is between about 2:1 to about 2:3 to maintain a low resistance for the word lines and to maintain a high data retention for the memory cells.

FIG. 17A illustrates the next step in the manufacturing process and depicts: a cross-sectional view along the X1-axis of FIG. 17B; a cross-sectional view along the X2-axis of FIG. 17B; and a cross-sectional view along the Y-axis of FIG. 17B. In this step, multiple etches are performed in order to define the word lines 204 (narrow lines shown in FIG. 7B) and the active device drive lines 205 (wide lines in FIG. 7B). First, the hard mask 600 is patterned using photolithography and a dry etch to define the word lines 204 and drive lines 205. That is, hard mask 600 is etched until portions of the metal layer 1602 are exposed. Then, after defining the word lines and drive lines with the hard mask 600, the exposed regions of the metal layer 1602 are etched until portions of the polysilicon electrode 212 are exposed. The exposed regions of the polysilicon electrode 212 are etched to expose portions of the inter-electrode dielectric 214, which are then etched, followed by etching of the exposed portions of the first electrode 210 down to the tunnel dielectric layer. By etching in this manner, openings 1700 are formed between, and thus electrically isolate, adjacent memory cells along the Y-axis.

Figure 18B:
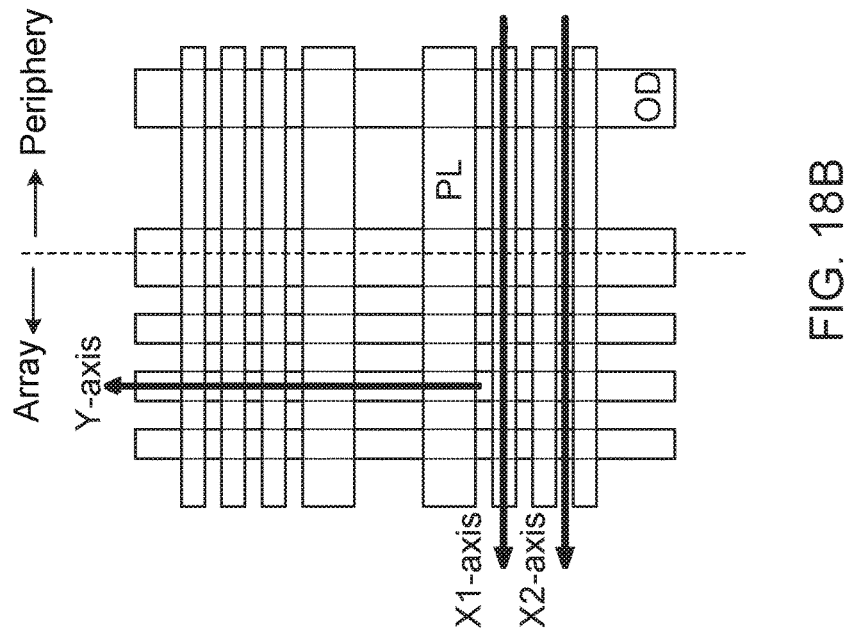
Figure 18A:
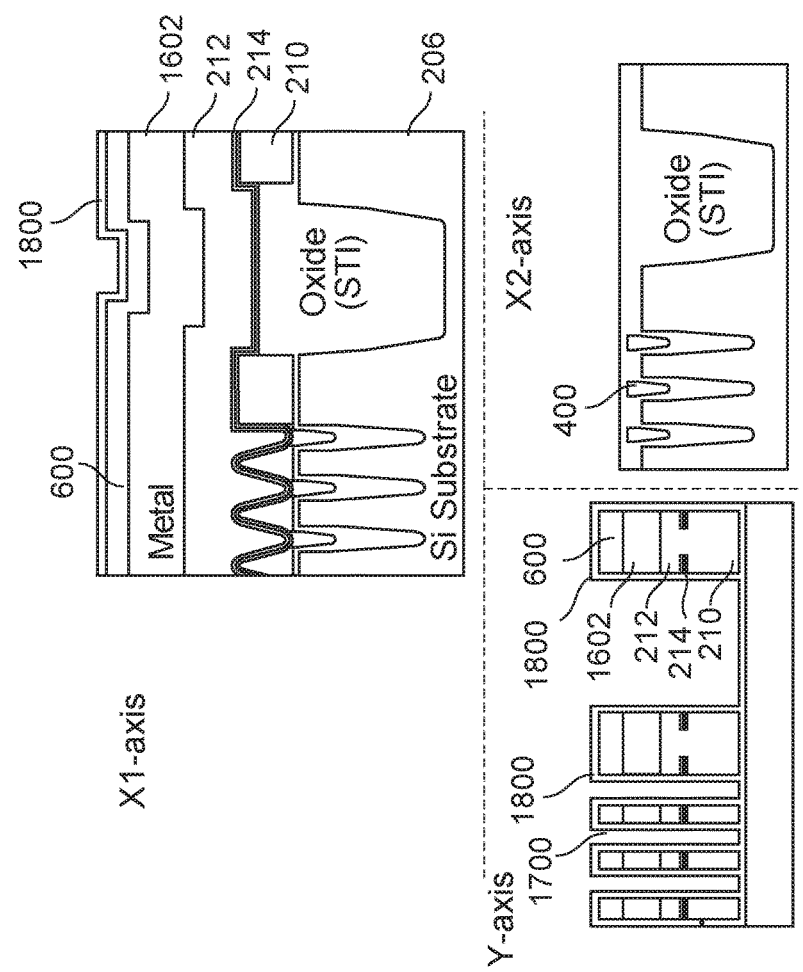

FIG. 18A illustrates the next step in the manufacturing process and depicts: a cross-sectional view along the X1-axis of FIG. 18B; a cross-sectional view along the X2-axis of FIG. 18B: and a cross-sectional view along the Y-axis of FIG. 18B. In this step, a buffer dielectric (e.g., a buffer silicon oxide) layer 1800 is deposited on the upper surface of the hard mask 600 and on the exposed sidewalls of the openings 1700 between adjacent memory cells (see, e.g., cross-sectional view along Y-axis) so that the buffer dielectric 1800 covers the exposed portions of the first electrode layer 210, the inter-electrode dielectric 214, the second electrode 212 and the metal layer 1602. By depositing the buffer dielectric layer 1800 on the sidewalls of the memory cells, the buffer dielectric layer 1800 protects the inter-electrode dielectric 214 from a later oxide etch step. The buffer dielectric 1800 also is deposited on the upper surface of the tunnel dielectric layer 208 (see, e.g., cross-sectional view along X2-axis) so that the exposed portions of the sacrificial dielectric 400 are covered with the buffer dielectric.

FIG. 19A illustrates the next step in the manufacturing process and depicts: a cross-sectional view along the X1-axis of FIG. 19B, a cross-sectional view along the X2-axis of FIG. 19B; and a cross-sectional view along the Y-axis of FIG. 19B. In this step, a portion of the buffer dielectric 1800 is removed by etching (e.g., dry etching) to expose the upper surface of the sacrificial dielectric 400 and the hard mask 600. A portion of the buffer oxide 1800 remains, however, on the sidewalls of the memory cells (see, e.g., cross-sectional view along the Y-axis).

Figures 20A, 20B:
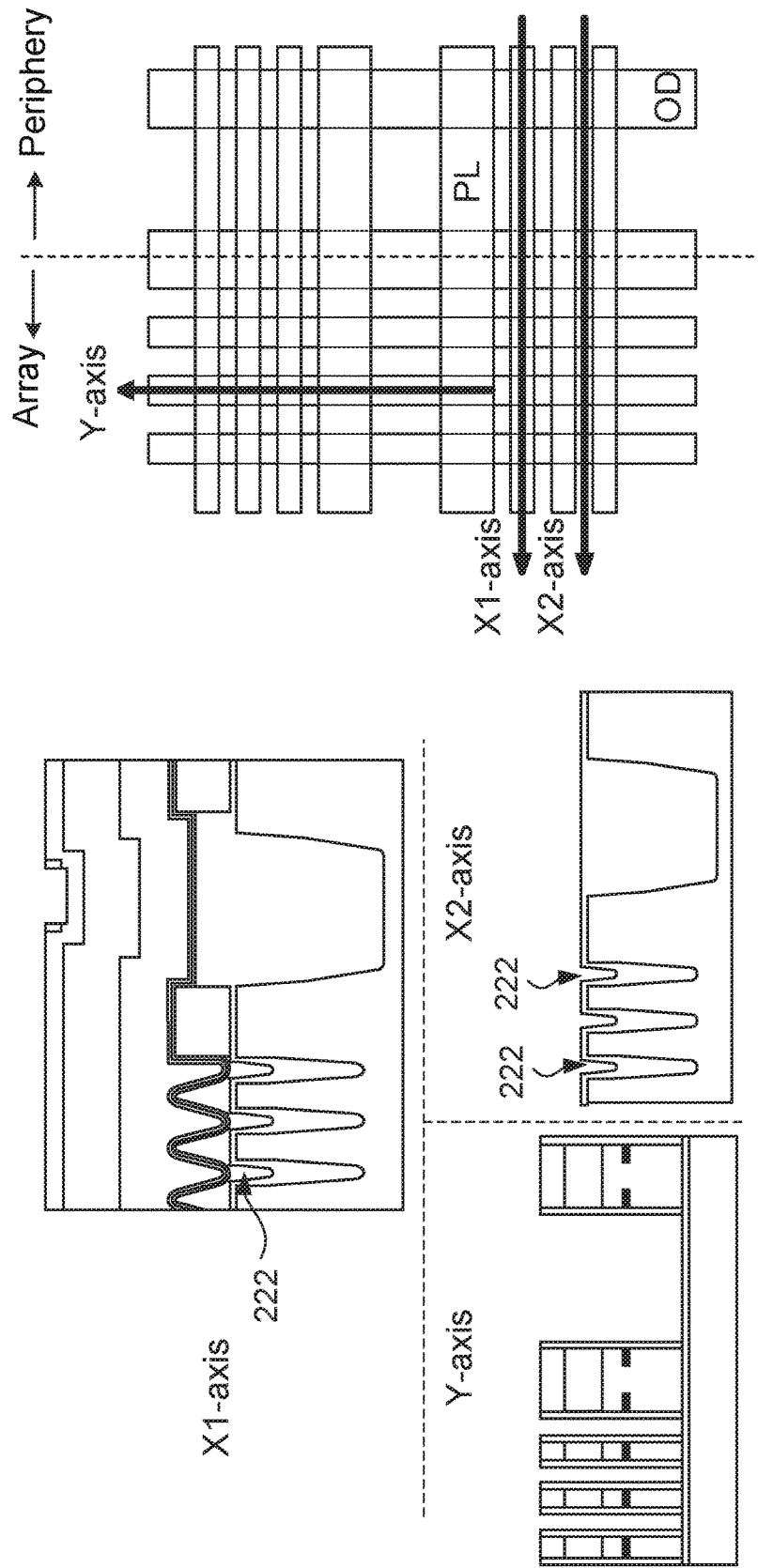

FIG. 20A illustrates the next step in the manufacturing process and depicts: a cross-sectional view along the X1-axis of FIG. 20B; a cross-sectional view along the X2-axis of FIG. 20B: and a cross-sectional view along the Y-axis of FIG. 20B. In this step, the sacrificial dielectric material 400 is removed. These materials can be removed using, e.g., a wet etchant solution or dry etching. Removing the sacrificial dielectric material results in the formation of first air gaps 222 under the inter-electrode dielectric 214 (see, e.g., the cross-sectional view along the X1 axis). The first air gaps 222 extend co-parallel with the bit lines between adjacent memory cells.

FIG. 21A illustrates the next step in the manufacturing process and depicts: a cross-sectional view along the X1-axis of FIG. 21B; a cross-sectional view along the X2-axis of FIG. 21B; and a cross-sectional view along the Y-axis of FIG. 21B. In this step, a cap dielectric layer 216 is formed on an upper surface of the hard mask 600. For example, the cap dielectric material may include a plasma enhanced chemical vapor deposition silicon oxide that is annealed at a high temperature. Because the distance between the memory cells is relatively narrow, and because the step coverage of the deposited cap layer dielectric 216 is relatively poor, the cap layer dielectric 216 joins together with adjacent cap layer dielectric material to form second air gaps 224 between adjacent memory cells. That is, the cap layer dielectric 216 essentially forms a bridge of dielectric material over the air gaps 224 (see, e.g., the cross-sectional views along the Y-axis and along the X2-axis). The bridged regions of the cap dielectric material 216 also lead to the formation of recessed regions 226. The thickness of the cap dielectric material 216 above the recessed regions is thinner than above the hard mask 600. The cap dielectric 216 and the hard mask 600 are fabricated such that the thickness, as determined from the top of control gate (i.e., a plane that is co-planar with the upper surface of the metal layer 1602 in this example) to the top of the second air gap 224 is greater than about 8 nm to achieve a low capacitance between word lines. If the thickness of the recessed region 226 the air gap between the top of control gate is less than about 8 nm, this will degrade the breakdown voltage and enhance coupling effect between adjacent memory cells. The upper limit to the thickness of the second air gap 224 (when metal is used as the second electrically conductive layer of a second electrode) depends on the amount of material remaining for the hard mask 600.

Figure 22B:
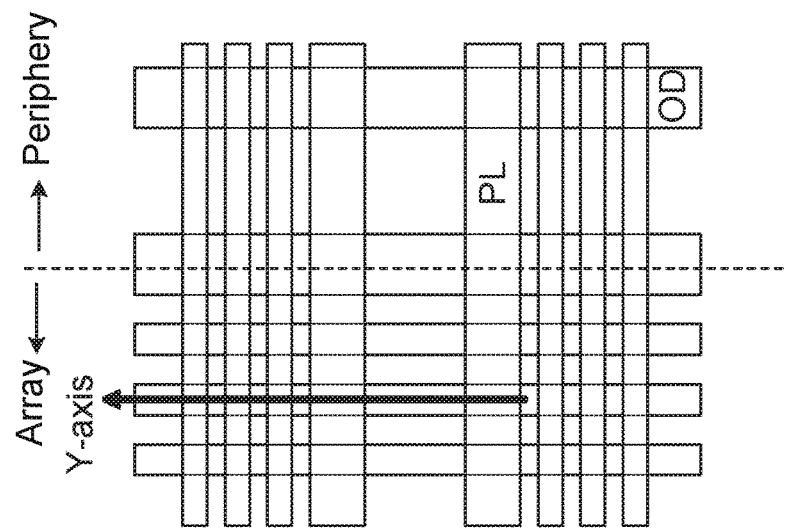
Figure 22A:
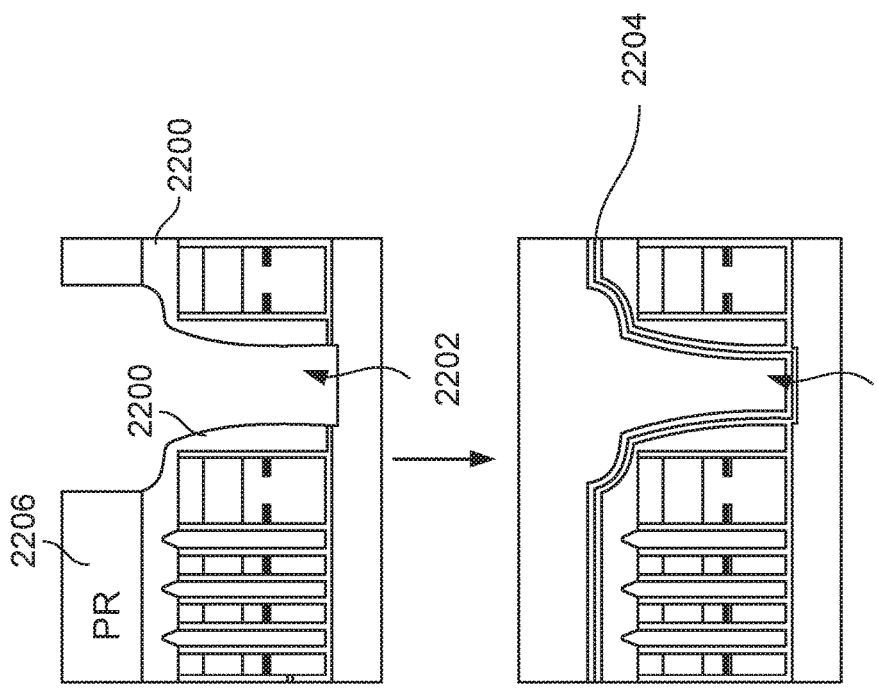

FIG. 22A illustrates the next step in the manufacturing process and depicts a cross-sectional view along the Y-axis of FIG. 22B. In this step, a spacer layer 2200 and contact dielectric region 2202 are formed. First, using a patterned photoresist layer 2206, the spacer layer 2200 is deposited on the surface of the cap dielectric layer 216 and in the contact region 2202. The spacer layer 2200 may include, e.g., an oxide such as silicon oxide. Then, the photoresist 2206 is removed and multiple layers of different dielectrics such as silicon oxides and a silicon nitride, are deposited within the contact dielectric region 2202. In contrast to the contact region 228 shown in FIG. 12A, the contact dielectric region 2202 includes a silicon nitride layer 2204 that extends above the cap dielectric 216. An example of an advantage of the process depicted in FIGS. 16-22 is that it can be used, in some implementations, to reduce the capacitance between adjacent polysilicon and/or metal interconnections. Additionally, replacing the silicide with metal may, in some implementations, simplify the process and reduce the control gate resistance further. Another advantage is that the aspect ratio of word line also can be reduced by decreasing the height of metal layer 1602, which, in some implementations, may facilitate etching of the word line and reduce the risk of word line bridging faults. Moreover, in some implementations, using the hard mask 600 makes it easier to control the height (t3) of air gap compared to a process that relies on silicidation.

Figure 23:
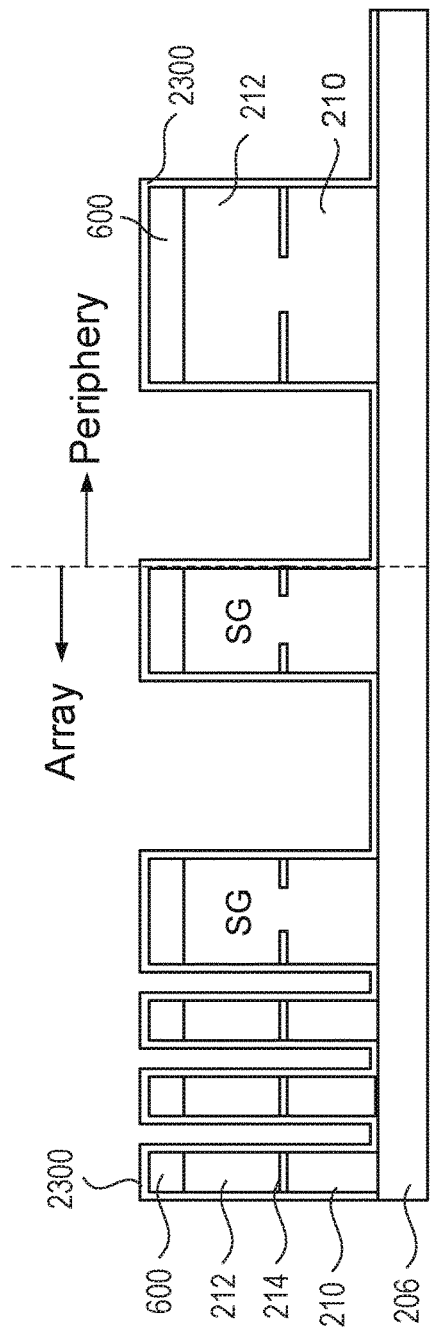

FIGS. 23-37 are schematics that illustrate an example process for forming the contact regions 228 shown in FIG. 2. Each of FIGS. 23-27 depicts a cross-sectional view of the device in both the array region, in which memory cells are formed, and in the peripheral region, in which the control/logic devices are formed. The process depicted in FIGS. 23-27 can be understood to begin after the definition of the word lines as shown in FIGS. 7A-7B. As shown in FIG. 23, a buffer dielectric layer 2300 (e.g., silicon oxide) is deposited on the upper surface of the hard mask 600. The buffer dielectric layer 2300 also covers the exposed sidewalls of the memory cells (including the exposed sidewalls of the hard mask 600, the second electrode 212, the inter-electrode dielectric 214, and the first electrode 210).

Figure 24:
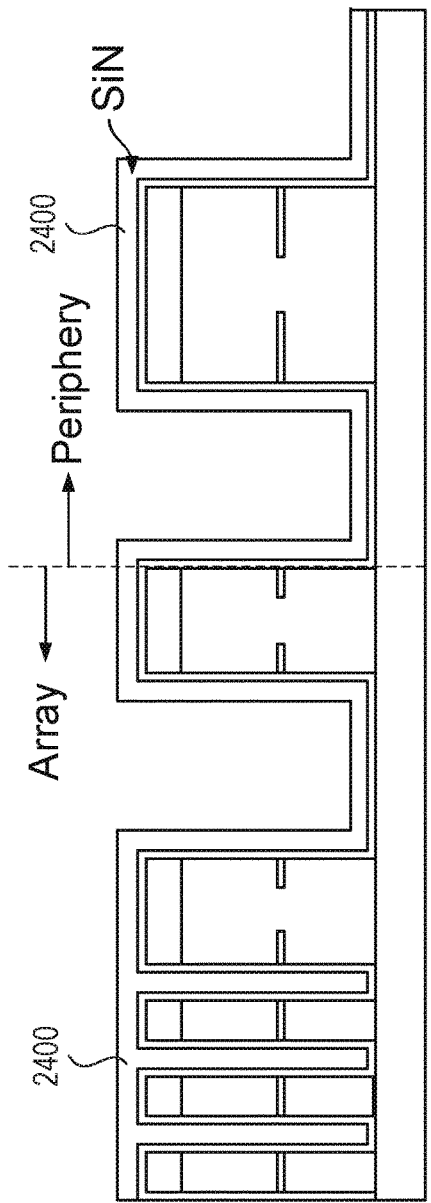

As shown in FIG. 24, a sacrificial material 2400 then is deposited on the upper surface of the buffer dielectric layer 2300. The sacrificial material 2400 can include, e.g., silicon nitride, and fills in the regions between adjacent memory cells.

As shown in FIG. 25, the sacrificial material 2400 that was present in the periphery region is removed using, e.g., a wet etch process such as $H_3PO_4$. The sacrificial material 2400 remains in the regions between adjacent memory cells in the array region but is etched enough that the upper surface of the buffer dielectric 2300 is exposed.

As shown in FIG. 26, several dielectric layers then are deposited on the device. The dielectric layers include a spacer layer 2600 formed from, e.g., silicon oxide, a first interlayer dielectric layer 2602 formed from, e.g., silicon nitride, and a third interlayer dielectric 2604 formed from, e.g., silicon oxide. The spacer layers 2600 are formed on the buffer dielectric sidewalls, whereas the first interlayer dielectric 2602 is formed on the exposed surface of the spacer layers 2600. The second interlayer dielectric 2604 then fills in the openings above the first interlayer dielectric 2604.

Figure 27:
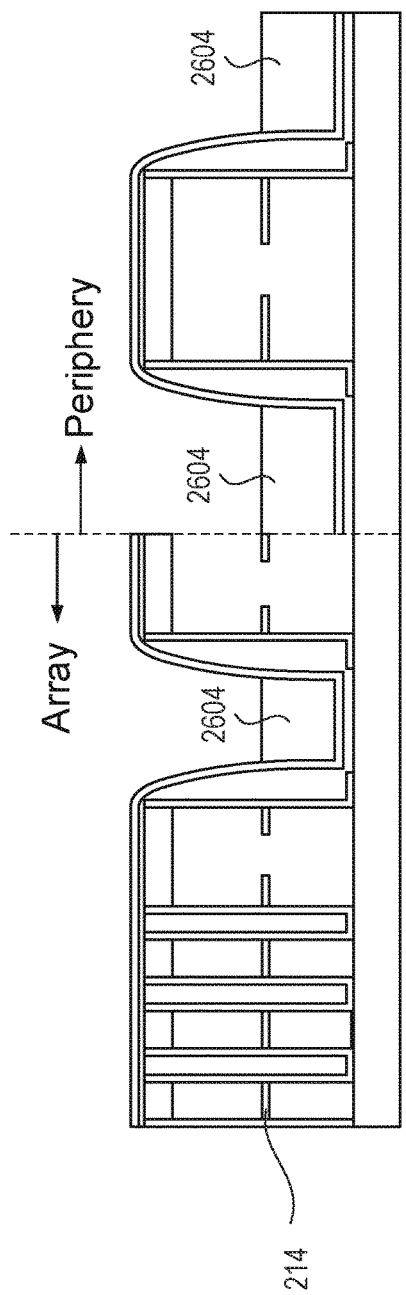

As shown in FIG. 27, a dielectric etch back step then is performed which etches a substantial portion of the second interlayer dielectric 2604 such that an upper surface of the second interlayer dielectric 2604 is about at the same plane as the inter-electrode dielectric 214.

Figure 28:
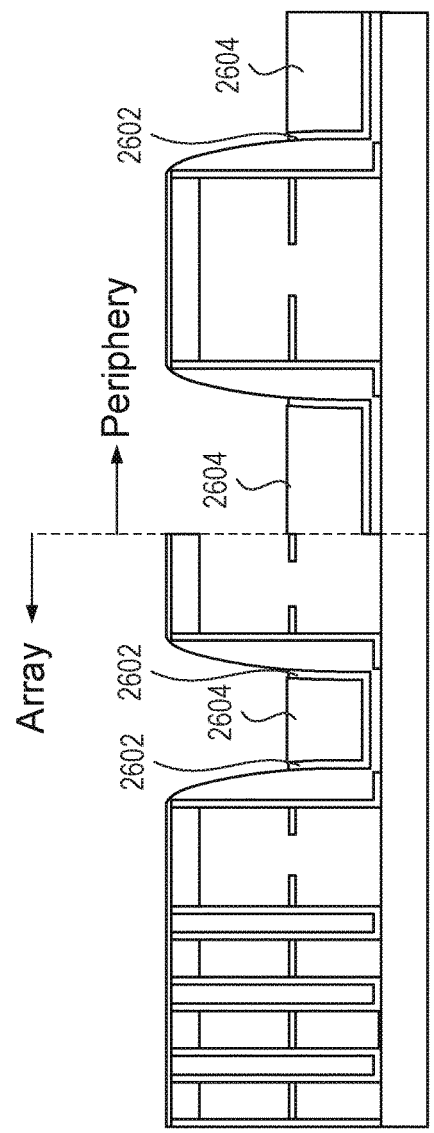

As shown in FIG. 28, a second interlayer dielectric etch back step then is performed, which etches a substantial portion of the first interlayer dielectric 2602 such that an upper surface of the first interlayer dielectric 2602 is about even with the upper surface of the second interlayer dielectric 2604.

Figure 29:
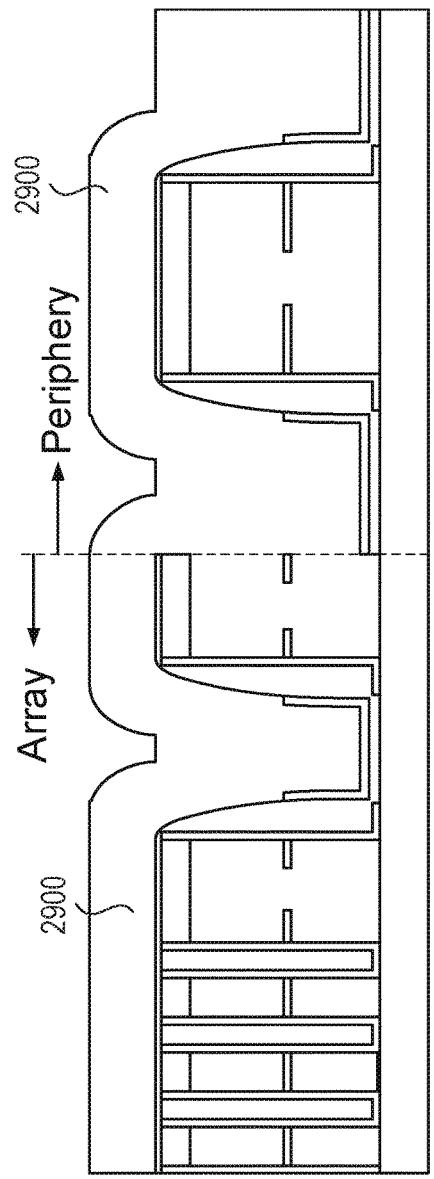
Figure 30:
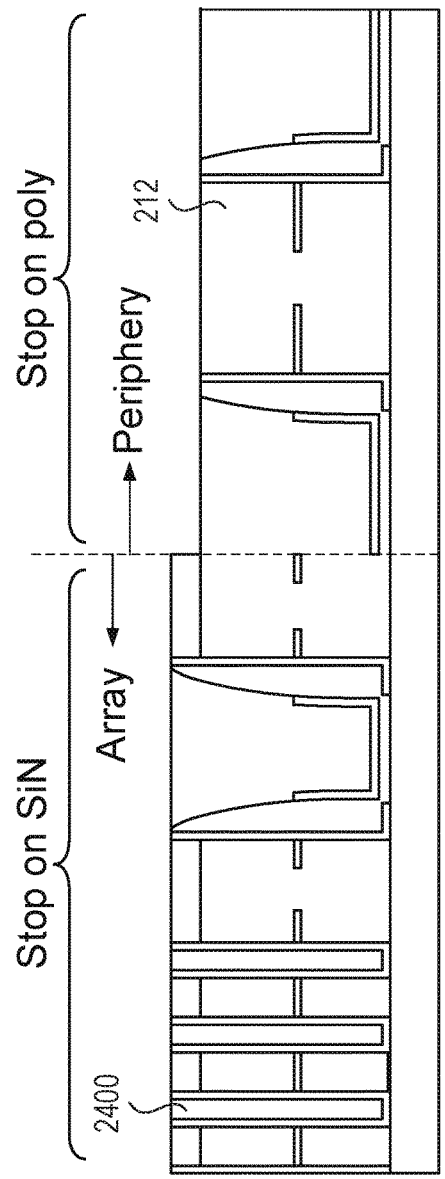

As shown in FIGS. 29-30, a dielectric deposition step and polishing step then are performed, in which the dielectric (e.g., silicon oxide) 2900 fills in the etched back openings within the contact regions 228. The polishing (e.g., chemical mechanical polishing) stops on the exposed sacrificial material 2400 in the array region the deposited dielectric 2900 and on the second electrode 212 in the periphery region.

As shown in FIG. 31, etching of the sacrificial material 2400 between adjacent memory cells in the array region then is performed. The sacrificial etch process is highly selective to the dielectric material 2300 that is on the sidewalls of the memory cells, as well as to the polysilicon of the electrodes. That is, the sacrificial material 2400 (e.g., silicon nitride) etches substantially faster than the dielectric 2300 (e.g., silicon oxide) and the polysilicon that forms electrode 212. Not all of the sacrificial material 2400 is removed in this step. Rather, as shown in FIG. 30, a portion of sacrificial material 2400 remains such that an upper surface of the sacrificial material 2400 is located above the inter-electrode dielectric 214 and below the upper surface of the electrode 212.

As shown in FIG. 32, etching of the interlayer dielectrics, as well as the sidewall dielectric 2300 then is performed. The dielectric 2300 is etched down to the same height as the upper surface of the sacrificial material 2400. The interlayer dielectric 2900 and spacer 2600 are also etched during this step.

As shown in FIG. 33, the remainder of the sacrificial material 2400 located between the memory cells in the array region is removed (e.g., through a wet etch solution of $H_3PO_4$). Other materials, such as the wall dielectrics 2300, interlayer dielectrics, spacer dielectric and polysilicon are substantially unaffected by the sacrificial material removal process.

As shown in FIG. 34, the next step in the process includes forming a silicide layer on the surface of the electrode 212. The formation of the silicide is similar to the process described with respect to FIGS. 15A-15B. For example, a layer of material (e.g., Co) is deposited on top of the second electrode 212. Then, the device is annealed at a high temperature. The high temperature anneal causes the Co (or other suitable material used to form the silicide) to diffuse into and bond with Si in the polysilicon layer 212. This diffusion and bonding process results in the silicide layer 3400, with the remaining portion of the electrode 212 left as polysilicon. In contrast to the process depicted in FIGS. 15A-15B, the silicide layer 3400 here is formed without depositing the cap layer first, though the silicide layer 3400 may be formed after the cap dielectric deposition, if desired. The diffusion and silicidation process is controlled so that ratio of the thickness of the silicide layer 3400 to the thickness of the remaining polysilicon layer of the second electrode 212 is between about 2:1 to about 4:1 to maintain a low resistance for the word lines and to maintain a high data retention for the memory cells. The silicide layer 3400 may include silicides, such as, e.g., $CoSi_2$, NiSi, PtSi, WSi, or MoSi.

Figure 35:
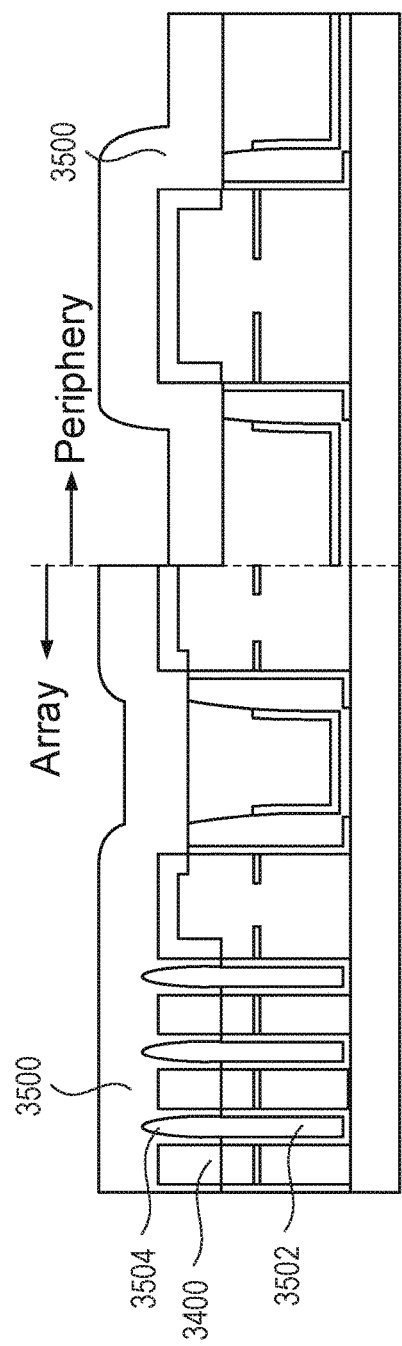

As shown in FIG. 35, the next step in the process includes forming the cap dielectric layer 3500 on the device in both the array and periphery regions. For example, the cap dielectric material 3500 may include a plasma enhanced chemical vapor deposition silicon oxide that is annealed at a high temperature. Because the step coverage of the deposited cap layer dielectric 3500 is relatively poor, the cap layer dielectric joins together with adjacent cap layer dielectric material over the openings/air gaps 3502 between memory cells, essentially forming a bridge of dielectric material over the air gaps 3502. The bridged regions of the cap dielectric material 3500 also lead to the formation of recessed regions 3504.

The thickness of the cap dielectric material 3500 above the recessed regions is thinner than above the silicide layer 3400. The thickness of the cap dielectric 3500 is fabricated such that the height/depth of the recessed region 3504 within the cap dielectric layer 3500 is between about 8 nm to about 12 nm to achieve a low capacitance between word lines. That is, the thickness of the recessed region 3504, as determined from the top of control gate (i.e., a plane that is co-planar with the top of the silicide layer 3400 in this example) to the top of the air gap 3502 is between about 8 nm and about 12 nm. If the thickness of the recessed region 3504 the air gap between the top of the word lines is less than about 8 nm, this will degrade the breakdown voltage and enhance coupling effect between adjacent memory cells. If the thickness of the recessed region 3504 is greater than about 12 nm, this means the deposition rate of cap oxide is relatively fast such that there is also likely to be an increase in the variation of film thickness and increase in the aspect ratio of contact, making these parameters non-uniform across the different memory cells, and leading to unacceptable variations in operating parameters and failures for the memory cells (e.g., due to open contacts).

Figure 36:
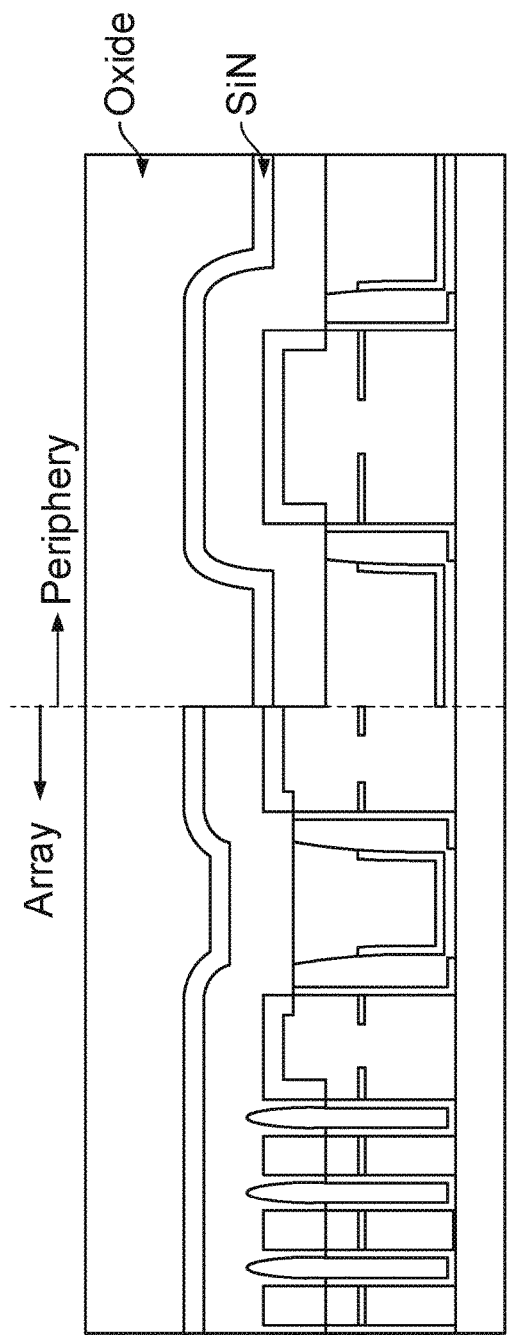

As shown in FIG. 36, another interlayer dielectric process then is performed, in which a first top interlayer dielectric layer 3600 is deposited on the upper surface of the cap dielectric layer 3500, and a second top interlayer dielectric layer 3602 is deposited on the upper surface of the first top interlayer dielectric layer 3600 in both the array and peripheral regions. The first top interlayer dielectric layer 3600 may include, e.g., silicon nitride. The second top interlayer dielectric layer 3602 may include, e.g., silicon oxide. Other dielectric materials may be used for the first and second top interlayer dielectric layers instead.

A number of embodiments have been described. Nevertheless, it will be understood that various modifications may be made without departing from the spirit and scope of the invention. Accordingly, other embodiments are within the scope of the following claims.

What is claimed is:
1. A semiconductor device comprising:
a semiconductor substrate;

a plurality of memory cells on the semiconductor substrate arranged along a first dimension and along a second dimension that is orthogonal to the first dimension; and a cap dielectric extending continuously across each memory cell of the plurality of memory cells, wherein each memory cell of the plurality of memory cells comprises a channel region in the semiconductor substrate, a tunnel dielectric layer on the channel region, a first electrode layer on the tunnel dielectric layer, and an inter-electrode dielectric layer extending continuously across each memory cell of the plurality of memory cells along the first dimension, wherein, along the first dimension, the channel region of each memory cell of the plurality of memory cells is separated from the channel region of an adjacent memory cell of the plurality of memory cells by a corresponding first air gap, each first air gap extending from below an upper surface of the semiconductor substrate to the inter-electrode dielectric layer, wherein the first air gap extends from below the upper surface of the semiconductor substrate up to and beyond an upper surface of the tunnel dielectric layer, and has a height of about 23 nm or less from a bottom surface of the inter-electrode dielectric layer to the upper surface of the semiconductor substrate, wherein at each first air gap, a bottom surface of the inter-electrode dielectric is exposed to the first air gap, wherein each memory cell of the plurality of memory cells further comprises a second electrode layer on the inter-electrode dielectric, and wherein, along the second dimension, the first electrode layer, the inter-electrode dielectric, and the second electrode layer of each memory cell of the plurality of memory cells are separated from an adjacent memory cell by a corresponding second air gap, each second air gap extending into the cap dielectric to form a distinct recessed region in the cap dielectric.

2. The semiconductor device of claim 1, wherein the second electrode layer comprises a first electrically conductive layer on the inter-electrode dielectric and a second electrically conductive layer on the first electrically conductive layer, the second electrically conductive layer comprises a silicide, and a ratio of a thickness of the second electrically conductive layer to a thickness of the first electrically conductive layer is between about 2:1 to about 4:1.

3. The semiconductor device of claim 1, wherein the second electrode layer comprises a first electrically conductive layer on the inter-electrode dielectric and a second electrically conductive layer on the first electrically conductive layer, the second electrically conductive layer comprises a metal, and a ratio of a thickness of the second electrically conductive layer to a thickness of the first electrically conductive layer is between about 2:1 to about 2:3.

4. The semiconductor device of claim 1, wherein the second electrode layer comprises a first electrically conductive layer on the inter-electrode dielectric and a second electrically conductive layer on the first electrically conductive layer, the second electrically conductive layer comprises a silicide, and wherein a depth to which each second air gap extends into the cap dielectric from a plane that is co-planar with an upper surface of the second electrode, is between about 8 nm and about 12 nm.

5. The semiconductor device of claim 1, wherein the second electrode layer comprises a first electrically conductive layer on the inter-electrode dielectric and a second electrically conductive layer on the first electrically conductive layer, the second electrically conductive layer comprises a metal, and wherein a depth to which each second air gap extends into the cap dielectric from a plane that is co-planar with an upper surface of the second electrode, is greater than about 8 nm.

6. A semiconductor device comprising:

a semiconductor substrate;

a plurality of memory cells on the semiconductor substrate, the plurality of memory cells being arranged along a first dimension and along a second dimension that is orthogonal to the first dimension, each memory cell of the plurality of memory cells comprising a tunnel dielectric layer on the semiconductor substrate, a first electrode layer on the tunnel dielectric layer, an inter-electrode dielectric on the first electrode layer, a second electrode layer on the inter-electrode dielectric;

a cap dielectric layer on the plurality of memory cells;

a plurality of first air gaps, each first air gap of the plurality of first air gaps being formed within the semiconductor substrate and extending along the first dimension to separate adjacent columns of memory cells along the second dimension, wherein each first air gap of the plurality of first air gaps has a height of about 23 nm or less between an exposed bottom surface of the inter-electrode dielectric and a plane that is co-planar with an upper surface of the semiconductor substrate; and a plurality of second air gaps, each second air gap of the plurality of second air gaps extending along the second dimension to separate adjacent rows of memory cells along the first dimension, wherein, along the second dimension, the first electrode layer, the inter-electrode dielectric, and the second electrode layer of each memory cell of the plurality of memory cells are separated from an adjacent memory cell by a corresponding second air gap, each second air gap extending into the cap dielectric to form a distinct recessed region in the cap dielectric.

7. The semiconductor device of claim 6, wherein, for each row of memory cells, the inter-electrode dielectric extends, along the second dimension, continuously across each memory cell within the row.

8. The semiconductor device of claim 6, wherein the second electrode layer comprises a first electrically conductive layer on the inter-electrode dielectric and a second electrically conductive layer on the first electrically conductive layer, the second electrically conductive layer comprises a silicide, and a ratio of a thickness of the second electrically conductive layer to a thickness of the first electrically conductive layer is between about 2:1 to about 4:1.

9. The semiconductor device of claim 6, wherein the second electrode layer comprises a first electrically conductive layer on the inter-electrode dielectric and a second electrically conductive layer on the first electrically conductive layer, the second electrically conductive layer comprises a metal, and a ratio of a thickness of the second electrically conductive layer to a thickness of the first electrically conductive layer is between about 2:1 to about 2:3.

10. The semiconductor device of claim 6, wherein the second electrode layer comprises a first electrically conductive layer on the inter-electrode dielectric and a second electrically conductive layer on the first electrically conductive layer, the second electrically conductive layer comprises a silicide, and wherein a depth to which each second air gap extends into the cap dielectric from a plane that is co-planar with an upper surface of the second electrode is between about 8 nm and about 12 nm.

11. The semiconductor device of claim 6, wherein the second electrode layer comprises a first electrically conductive layer on the inter-electrode dielectric and a second electrically conductive layer on the first electrically conductive layer, the second electrically conductive layer comprises a metal, and wherein a depth to which each second air gap extends into the cap dielectric from a plane that is co-planar with an upper surface of the second electrode is greater than about 8 nm.

12. A method of fabricating a semiconductor memory device, the method comprising:

providing a semiconductor substrate comprising a tunnel dielectric layer on an upper surface of the semiconductor substrate and a first electrode layer on an upper surface of the tunnel dielectric layer;

forming a plurality of first isolation regions within the semiconductor substrate and the tunnel dielectric layer, the plurality of first isolation regions extending along a first dimension, each first isolation region separating adjacent bit lines arranged along a second dimension that is orthogonal to the first dimension;

filling the plurality of first isolation regions with a first sacrificial material;

removing a portion of the first sacrificial material to leave a remaining portion of first sacrificial material;

forming an inter-electrode dielectric on the upper surface of the first electrode layer and on an upper surface of the remaining portion of first sacrificial material;

forming a second electrode layer on the inter-electrode dielectric;

patterning the second electrode layer, the inter-electrode dielectric and the first electrode layer to form a plurality of second isolation regions, the plurality of second isolation regions extending along the second dimension, each second isolation region separating adjacent word lines arranged along the first dimension;

removing the remaining portion of first sacrificial material to form a first air gap having a height of about 23 nm or less that extends from a bottom surface of the inter-electrode dielectric layer to the upper surface of the semiconductor substrate; and depositing a second sacrificial material in the plurality of second isolation regions;

removing a portion of the second sacrificial material from the second isolation regions such that a first section of the second electrode layer has a first thickness extending from the inter-electrode dielectric to an upper surface of the second sacrificial material, and a second section of the second electrode layer has a second thickness extending from the upper surface of the second sacrificial material to an upper surface of the second electrode layer;

removing the second sacrificial material to form a plurality of second air gaps in the second isolation regions; and forming a cap dielectric on the second electrode layer.

13. The method of manufacturing a semiconductor memory device of claim 12, further comprising transforming the second section of the second electrode layer from a polysilicon to a silicide, wherein a ratio of the second thickness to the first thickness is between about 2:1 to about 4:1.

14. The method of manufacturing a semiconductor memory device of claim 13, wherein the plurality of second air gaps extend above an upper surface of the second electrode layer and partially into the cap dielectric, and wherein a depth to which each second air gap extends into the cap dielectric from a plane that is co-planar with the upper surface of the second electrode layer is between about 8 nm and about 12 nm.

15. The method of manufacturing a semiconductor memory device of claim 12, wherein forming the second electrode layer comprises:

depositing a polysilicon material on the upper surface of the inter-electrode dielectric; and depositing a metal layer on the polysilicon material, wherein a ratio of a thickness of the metal layer to a thickness of the polysilicon material is between about 2:1 to about 2:3.

16. The method of manufacturing a semiconductor memory device of claim 15, wherein the plurality of second air gaps extend above an upper surface of the second electrode layer and partially into the cap dielectric, and wherein a depth to which each second air gap extends into the cap dielectric from a plane that is co-planar with the upper surface of the second electrode layer is greater than about 8 nm.

* * * * *